(12) United States Patent
Yamada et al.

(10) Patent No.: US 9,583,608 B2
(45) Date of Patent: Feb. 28, 2017

(54) NITRIDE SEMICONDUCTOR DEVICE AND METHOD FOR MANUFACTURING NITRIDE SEMICONDUCTOR DEVICE

(71) Applicant: Panasonic Intellectual Property Management Co., Ltd., Osaka-shi, Osaka (JP)

(72) Inventors: Yasuhiro Yamada, Hyogo (JP); Yoshiharu Anda, Osaka (JP); Asamira Suzuki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 91 days.

(21) Appl. No.: 14/418,589

(22) PCT Filed: May 24, 2013

(86) PCT No.: PCT/JP2013/003306
§ 371 (c)(1),
(2) Date: Jan. 30, 2015

(87) PCT Pub. No.: WO2014/020809
PCT Pub. Date: Feb. 6, 2014

(65) Prior Publication Data
US 2015/0311331 A1  Oct. 29, 2015

(30) Foreign Application Priority Data

Aug. 3, 2012 (JP) .................................. 2012-172632

(51) Int. Cl.
*H01L 29/778* (2006.01)
*H01L 29/66* (2006.01)
(Continued)

(52) U.S. Cl.
CPC ...... *H01L 29/7787* (2013.01); *H01L 21/0242* (2013.01); *H01L 21/0254* (2013.01);
(Continued)

(58) Field of Classification Search
CPC ........... H01L 29/66262; H01L 29/2003; H01L 29/66462; H01L 29/7787
See application file for complete search history.

(56) References Cited

U.S. PATENT DOCUMENTS 6,432,779 B1 * 8/2002 Hobbs ............... H01L 21/28035
257/E21.197
7,709,291 B2 * 5/2010 Nakagawa ............... B41M 3/00
427/97.3
(Continued)

FOREIGN PATENT DOCUMENTS

JP   2002-170990   6/2002
JP   2004-273486   9/2004
(Continued)

OTHER PUBLICATIONS

International Preliminary Report on Patentability, Feb. 2015; PCT/JP2013/003306 (5 pages)
(Continued)

*Primary Examiner* — Lex Malsawma
*Assistant Examiner* — Xia L Cross
(74) *Attorney, Agent, or Firm* — Hamre, Schumann, Mueller & Larson, P.C.

(57) ABSTRACT

A nitride semiconductor device of the present invention has a source-electrode-side insulator protection film layer disposed between a source electrode and a drain electrode on a second nitride semiconductor layer and formed at least partially covering the source electrode, a drain-electrode-side insulator protection film layer disposed separately from the source-electrode-side insulator protection film layer and
(Continued)

formed at least partially covering the drain electrode, and a gate layer formed in contact with the second nitride semiconductor layer between the source-electrode-side insulator protection film layer and the drain-electrode-side insulator protection film layer and made of a p-type metal oxide semiconductor, and the gate layer has regions opposite to the second nitride semiconductor layer across each of the source-electrode-side insulator protection film layer and the drain-electrode-side insulator protection film layer and a region in contact with the second nitride semiconductor layer.

15 Claims, 6 Drawing Sheets

(51) Int. Cl.
| | |
|---|---|
| *H01L 21/285* | (2006.01) |
| *H01L 29/205* | (2006.01) |
| *H01L 29/417* | (2006.01) |
| *H01L 29/49* | (2006.01) |
| H01L 29/267 | (2006.01) |
| H01L 29/10 | (2006.01) |
| H01L 29/20 | (2006.01) |
| H01L 29/423 | (2006.01) |
| H01L 21/02 | (2006.01) |
| H01L 23/00 | (2006.01) |

(52) U.S. Cl.
CPC .. *H01L 21/02378* (2013.01); *H01L 21/02381* (2013.01); *H01L 21/02433* (2013.01); *H01L 21/02458* (2013.01); *H01L 21/02502* (2013.01); *H01L 21/02516* (2013.01); *H01L 21/28556* (2013.01); *H01L 29/205* (2013.01); *H01L 29/41758* (2013.01); *H01L 29/4966* (2013.01); *H01L 29/66462* (2013.01); *H01L 29/7786* (2013.01); H01L 21/02565 (2013.01); H01L 21/02579 (2013.01); H01L 23/564 (2013.01); H01L 29/1066 (2013.01); H01L 29/2003 (2013.01); H01L 29/267 (2013.01); H01L 29/42316 (2013.01); H01L 2924/0002 (2013.01)

(56) References Cited

U.S. PATENT DOCUMENTS

| | | | |
|---|---|---|---|
| 7,859,021 B2 | 12/2010 | Kaneko | |
| 2003/0183885 A1* | 10/2003 | Nishikawa | ........ H01L 21/28185 257/410 |
| 2007/0176215 A1 | 8/2007 | Yanagihara et al. | |
| 2008/0164463 A1* | 7/2008 | Kawashima | ........ H01L 51/0022 257/40 |
| 2009/0057720 A1* | 3/2009 | Kaneko | ............ H01L 29/42316 257/194 |
| 2009/0078966 A1* | 3/2009 | Asai | .................. H01L 29/66462 257/194 |
| 2010/0149816 A1* | 6/2010 | Higashi | ................. H01L 33/508 362/293 |
| 2010/0208411 A1* | 8/2010 | Sullivan | ................. C01G 53/04 361/321.5 |
| 2011/0079797 A1* | 4/2011 | Sumida | ............... H01L 51/5275 257/88 |
| 2011/0233538 A1* | 9/2011 | Iwakami | ............. H01L 29/1029 257/43 |
| 2011/0316049 A1* | 12/2011 | Sugimoto | ........... H01L 29/7788 257/194 |
| 2012/0140506 A1* | 6/2012 | Waragawa | .......... H01L 25/0753 362/516 |
| 2013/0168687 A1* | 7/2013 | Kuo | ..................... H01L 29/2003 257/76 |
| 2014/0138678 A1* | 5/2014 | Ito | ....................... H01L 29/7869 257/43 |

FOREIGN PATENT DOCUMENTS

| | | |
|---|---|---|
| JP | 2007-081231 | 3/2007 |
| JP | 2007-201279 | 8/2007 |
| JP | 2008-218696 | 9/2008 |
| JP | 2009-076845 | 4/2009 |
| JP | 2010-153748 | 7/2010 |
| JP | 2011-204717 | 10/2011 |

OTHER PUBLICATIONS

International Search Report., Aug. 12, 2013; PCT/JP2013/003306 (2 pages).

* cited by examiner

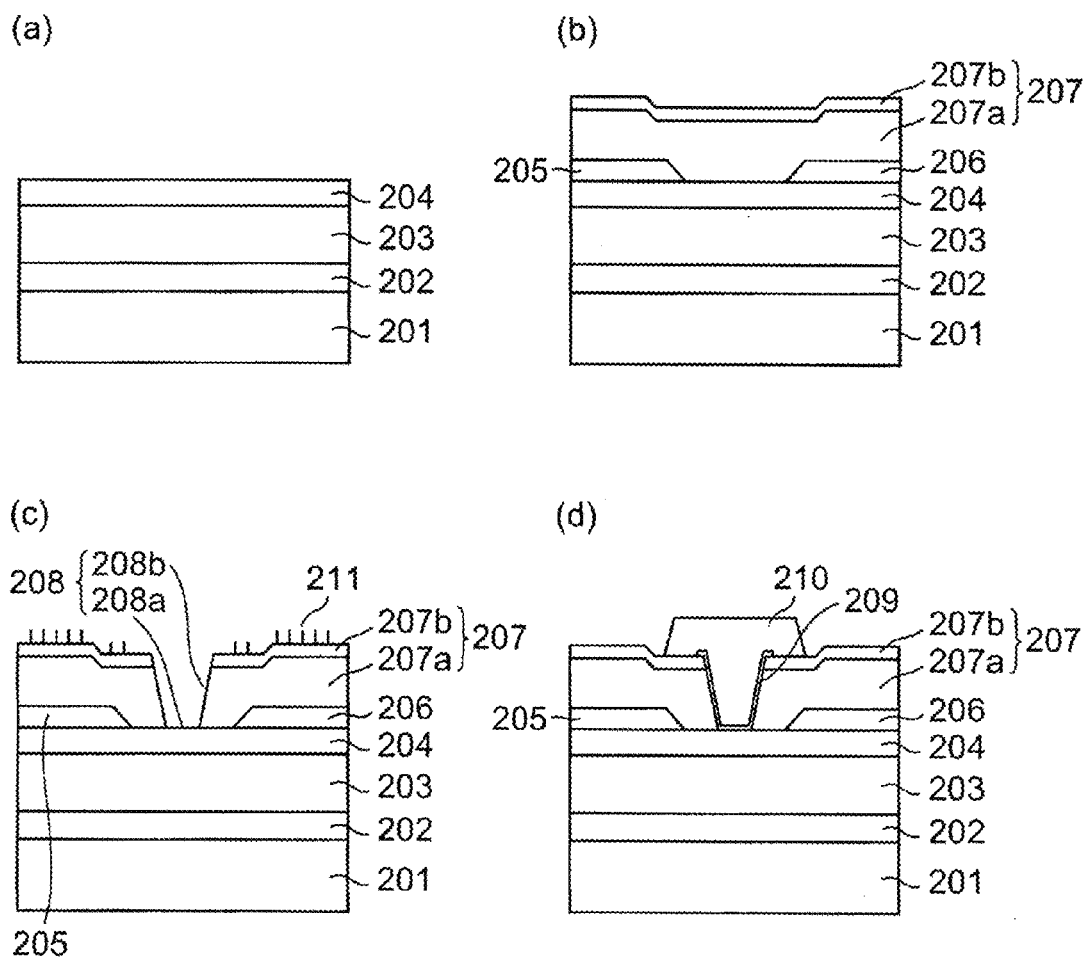

Fig.7
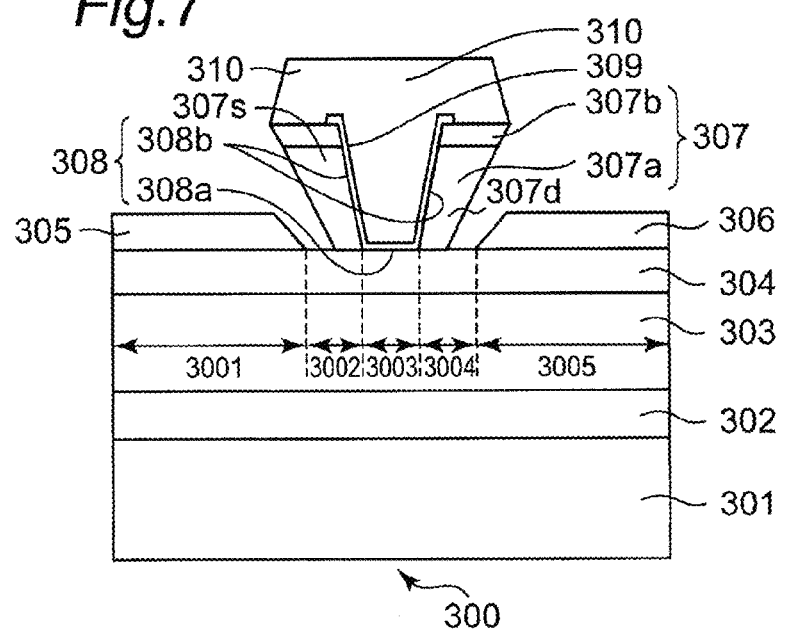
Fig.8
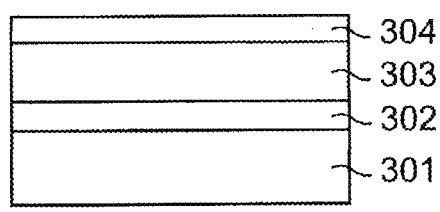
(a)
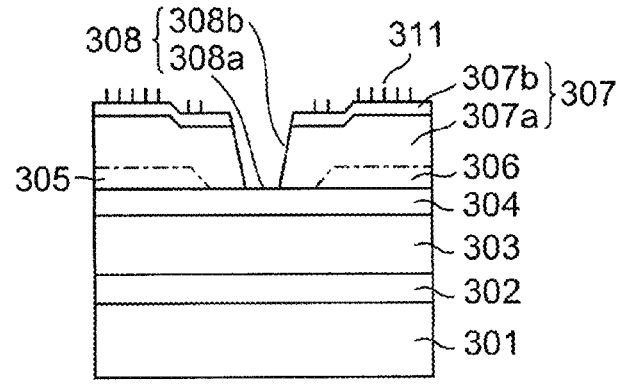
(b)
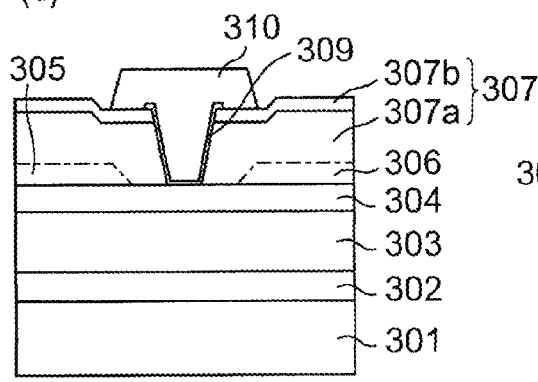
(c)
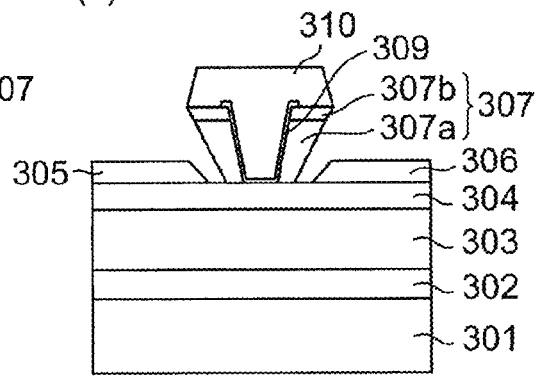
(d)

NITRIDE SEMICONDUCTOR DEVICE AND METHOD FOR MANUFACTURING NITRIDE SEMICONDUCTOR DEVICE

TECHNICAL FIELD

The present invention relates to a nitride semiconductor device and a method of manufacturing a nitride semiconductor device.

BACKGROUND ART

FIG. 10 is a cross-sectional view of a hetero-junction field effect transistor (HFET) described in Japanese Laid-Open Patent Publication No. 2004-273486 (Patent Document 1).

An HFET 100 depicted in FIG. 10 has a nitride buffer layer 102, a first nitride semiconductor layer 103, and a second nitride semiconductor layer 104 formed in this order on a substrate 101.

The HFET 100 depicted in FIG. 10 also includes a source electrode 105, a gate layer 109, a gate electrode 110, and a drain electrode 106. The source electrode 105, the gate layer 109, and the drain electrode 106 are formed separately from each other on the second nitride semiconductor layer 104. The gate electrode 110 is formed on the gate layer 109. A material of the gate layer 209 is a p-type semiconductor layer.

In the HFET 100 depicted in FIG. 10, a two-dimensional electron gas (2DEG) generated in an interface between the second nitride semiconductor layer 104 and the first nitride semiconductor layer 103 acts as a channel.

The HFET desirably has a normally-off characteristic. As used herein, the "normally-off characteristic" refers to a state in which a thickness of a depletion layer immediately below a gate is sufficiently thick while no electron is present when the gate voltage is 0 V.

When a predetermined voltage is applied between the source electrode 105 and the drain electrode 106, electrons in the channel move from the source electrode 105 to the drain electrode 106. In this case, the "normally-off characteristic" means that no drain current flows when the gate voltage is 0 V, i.e., when no voltage is applied to the gate electrode 110.

A conventional nitride semiconductor device has the gate layer 109 made of a P-type semiconductor disposed as described above so as to acquire the normally-off characteristic. The P-type semiconductor depletes the electrons of the two-dimensional electron gas (2DEG) immediately below the gate layer 109 to acquire the normally-off characteristic.

A nitride semiconductor device disclosed in Japanese Laid-Open Patent Publication No. 2009-076845 (Patent Document 2) uses NiO as the P-type semiconductor.

CITATION LIST

Patent Literature

PLT 1: JP 2004-273486 A
PLT 2: JP 2009-076845 A

SUMMARY OF INVENTION

Technical Problem

A problem solved by the present invention is to provide a nitride semiconductor device having a normally-off characteristic and capable of reducing an ON-resistance.

Solution to Problem

A nitride semiconductor device according to a configuration of the present invention comprises
 a substrate;
 a nitride buffer layer formed on the substrate;
 a first nitride semiconductor layer formed on the nitride buffer layer;
 a second nitride semiconductor layer formed on the first nitride semiconductor layer and made of a material having a band gap larger than the first nitride semiconductor layer;
 a source electrode formed on the second nitride semiconductor layer;
 a drain electrode formed on the second nitride semiconductor layer and formed separately from the source electrode;
 a source-electrode-side insulator protection film layer disposed between the source electrode and the drain electrode on the second nitride semiconductor layer and formed at least partially covering the source electrode;
 a drain-electrode-side insulator protection film layer disposed separately from the source-electrode-side insulator protection film layer on the second nitride semiconductor layer and formed at least partially covering the drain electrode;
 a gate layer formed between the source-electrode-side insulator protection film layer and the drain-electrode-side insulator protection film layer to be in contact with the second nitride semiconductor layer, the gate layer being made of a p-type metal oxide semiconductor; and
 a gate electrode formed entirely covering the gate layer and at least partially covering the insulator protection film layers,
 the gate layer including regions opposite to the second nitride semiconductor layer across each of the source-electrode-side insulator protection film layer and the drain-electrode-side insulator protection film layer and a region in contact with the second nitride semiconductor layer.

A method of manufacturing a nitride semiconductor device according to a configuration of the present invention comprises the steps of:
 forming a nitride buffer layer on a substrate;
 forming a first nitride semiconductor layer on the nitride buffer layer;
 forming a second nitride semiconductor layer on the first nitride semiconductor layer, the second nitride semiconductor layer having an Al composition higher than the first nitride semiconductor layer;
 forming a source electrode and a drain electrode on the second nitride semiconductor layer at a distance from each other;
 forming an insulator protection film layer on the second nitride semiconductor layer including upper portions of the source electrode and the drain electrode;
 forming an opening portion in the insulator protection film layer between the source electrode and the drain electrode;
 forming a gate layer to cover the opening portion and at least a portion of the insulator protection film layer; and
 forming a gate electrode on the gate layer, wherein
 in the method of manufacturing the gate layer,
 the opening portion is configured to have a surface of the second nitride semiconductor layer and a surface of the insulator protection film layer, and wherein
 the step of forming the gate layer includes a water repellent film forming step of applying patterning through chemical modification with a water repellent film layer onto the insulator protection film layer except a region to be provided with the gate layer so as to selectively grow the gate layer by using an atomic layer deposition method.

Advantageous Effects of Invention

The present invention can provide the nitride semiconductor device having a normally-off characteristic and capable of reducing an ON-resistance and a method of manufacturing the nitride semiconductor device.

BRIEF DESCRIPTION OF DRAWINGS

FIG. 2 is diagrams showing steps of a method of manufacturing the nitride semiconductor device of the first embodiment according to the present invention.

FIG. 7 is a cross-sectional view of a nitride semiconductor device of a second embodiment according to the present invention.

FIG. 8 is diagrams showing a method of manufacturing a nitride semiconductor device of the second embodiment according to the present invention.

DESCRIPTION OF EMBODIMENTS

A nitride semiconductor device and a method of manufacturing a nitride semiconductor device of the present invention will now be described with reference to the accompanying drawings. Although the present invention will be described in terms of the following embodiments with reference to the accompanying drawings, this is intended to be illustrative and it is not intended to limit the present invention to these configurations.
(Finding of Inventors)

Figure 10:
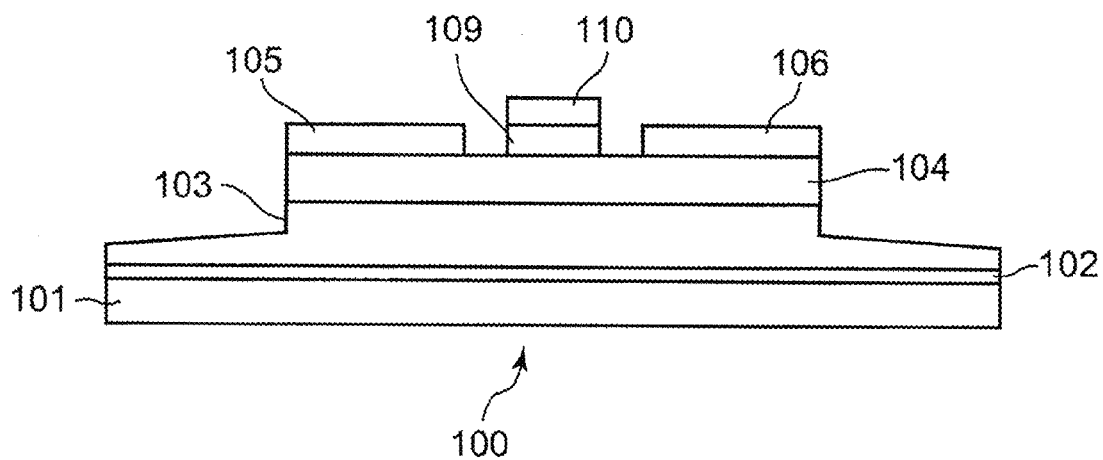
FIG. 10 is the cross-sectional view of the conventional HFET.

If it is difficult to form the gate layer 109 made up of a p-type semiconductor layer having a high hole concentration in a nitride semiconductor device as depicted in FIG. 10, the second nitride semiconductor layer 104 must be formed thin or an Al composition of the second nitride semiconductor layer 104 must be reduced, so as to acquire the normally-off characteristic.

Such a configuration reduces an electron concentration of a two-dimensional electron gas (2DEG) layer and increases the ON-resistance between the source electrode 105 and the drain electrode 106. The normally-off characteristic and a reduction in ON-resistance are in a trade-off relationship in the nitride semiconductor device and are difficult to satisfy at the same time.

To acquire the normally-off characteristic in the nitride semiconductor device of Patent Document 1, for example, it is conceivable that the second nitride semiconductor layer 104 under the gate layer 109 is reduced in thickness. In this case, the carrier concentration of the two-dimensional electron gas (2DEG) layer becomes lower while a resistance becomes higher between a source and a gate and between a drain and the gate. This leads to a problem of a high ON-resistance.

To acquire the normally-off characteristic in the nitride semiconductor device of Patent Document 2, the second nitride semiconductor layer immediately below the gate layer is formed thin. Since the second nitride semiconductor layer immediately below the gate layer is formed thin, the electron concentration of the two-dimensional electron gas (2DEG) layer immediately below the gate layer decreases. As a result, the configuration of the nitride semiconductor device of Patent Document 2 has a problem of a high ON-resistance.

As described above, the present inventors found that a conventional nitride semiconductor device (HFET) is very difficult to satisfy both a configuration having a normally-off characteristic and a configuration reducing an ON-resistance. Based on this finding, the present inventors invent a configuration of a nitride semiconductor device having a normally-off characteristic and capable of reducing an ON-resistance.

A nitride semiconductor device of a first aspect according to the present invention comprises a substrate;

a nitride buffer layer formed on the substrate;

a first nitride semiconductor layer formed on the nitride buffer layer;

a second nitride semiconductor layer formed on the first nitride semiconductor layer and made of a material having a band gap larger than the first nitride semiconductor layer;

a source electrode formed on the second nitride semiconductor layer;

a drain electrode formed on the second nitride semiconductor layer and formed separately from the source electrode;

a source-electrode-side insulator protection film layer disposed between the source electrode and the drain electrode on the second nitride semiconductor layer and formed at least partially covering the source electrode;

a drain-electrode-side insulator protection film layer disposed separately from the source-electrode-side insulator protection film layer on the second nitride semiconductor layer and formed at least partially covering the drain electrode;

a gate layer formed between the source-electrode-side insulator protection film layer and the drain-electrode-side insulator protection film layer to be in contact with the second nitride semiconductor layer, the gate layer being made of a p-type metal oxide semiconductor; and a gate electrode formed entirely covering the gate layer and at least partially covering the insulator protection film layers, the gate layer including regions opposite to the second nitride semiconductor layer across each of the source-electrode-side insulator protection film layer and the drain-electrode-side insulator protection film layer and a region in contact with the second nitride semiconductor layer.

A nitride semiconductor device of a second aspect according to the present invention comprises a substrate;

a nitride buffer layer formed on the substrate;

a first nitride semiconductor layer formed on the nitride buffer layer;

a second nitride semiconductor layer formed on the first nitride semiconductor layer and having an Al composition higher than the first nitride semiconductor layer;

a source electrode and a drain electrode formed on the second nitride semiconductor layer at a distance from each other;

an insulator protection film layer formed in a region between the source electrode and the drain electrode and having an opening portion for division into a source electrode side and a drain electrode side;

a gate layer formed covering at least a side surface and a bottom surface of the opening portion; and a gate electrode formed covering the gate layer, the side surface of the opening portion being a surface of the insulator protection film layer, the bottom surface of the opening portion being a surface of the second nitride semiconductor layer, the source electrode, the gate layer, and the drain electrode being formed on the same plane on the second nitride semiconductor layer, the gate layer being made of a p-type metal oxide semiconductor.

A nitride semiconductor device of a third aspect according to the present invention comprises a substrate;

a nitride buffer layer formed on the substrate;

a first nitride semiconductor layer formed on the nitride buffer layer;

a second nitride semiconductor layer formed on the first nitride semiconductor layer and having an Al composition higher than the first nitride semiconductor layer;

a source electrode and a drain electrode formed on the second nitride semiconductor layer at a distance from each other;

an insulator protection film layer formed in a region between the source electrode and the drain electrode and having an opening portion for division into a source electrode side and a drain electrode side;

a gate layer formed covering at least a side surface and a bottom surface of the opening portion; and a gate electrode formed covering the gate layer, the side surface of the opening portion being a surface of the insulator protection film layer, the bottom surface of the opening portion being a surface of the second nitride semiconductor layer, the gate layer formed in the opening portion of the insulator protection film layer being divided via a space for the source electrode and the drain electrode, the source electrode, the gate layer, and the drain electrode being formed on the same plane on the second nitride semiconductor layer, the gate layer being made of a p-type metal oxide semiconductor.

A nitride semiconductor device of a fourth aspect according to the present invention is the nitride semiconductor device of any one of the first aspect to the third aspect, wherein the source electrode and the drain electrode have a distance between electrodes equal to or less than 5 µm, preferably.

A nitride semiconductor device of a fifth aspect according to the present invention is the nitride semiconductor device of any one of the first aspect to the third aspect, wherein the p-type metal oxide semiconductor is nickel oxide, preferably.

A nitride semiconductor device of a sixth aspect according to the present invention is the nitride semiconductor device of any one of the first aspect to the third aspect, wherein the hole concentration of the p-type metal oxide semiconductor is equal to or greater than $1\times10^{17}$ cm$^{-3}$ and equal to or less than $1\times10^{19}$ cm$^{-3}$, preferably.

A nitride semiconductor device of a seventh aspect according to the present invention is the nitride semiconductor device of the fifth aspect, wherein the p-type metal oxide semiconductor made of nickel oxide is doped with an alkali metal including lithium, sodium, potassium, rubidium, and cesium equal to or greater than $1\times10^{17}$ cm$^{-3}$ and equal to or less than $1\times10^{21}$ cm$^{-3}$, preferably.

A nitride semiconductor device of an eighth aspect according to the present invention is the nitride semiconductor device of any one of the first aspect to the third aspect, wherein the p-type metal oxide semiconductor is a monocrystalline semiconductor having a (111) orientation, preferably.

A nitride semiconductor device of a ninth aspect according to the present invention is the nitride semiconductor device of the second aspect or the third aspect, wherein the p-type metal oxide semiconductor may be formed in the opening potion and an upper portion of the insulator protection film layer.

A nitride semiconductor device of a tenth aspect according to the present invention is the nitride semiconductor device of the second aspect or the third aspect, wherein the p-type metal oxide semiconductor may be formed only in the opening potion.

A nitride semiconductor device of an eleventh aspect according to the present invention is the nitride semiconductor device of any one of the first aspect to the third aspect, wherein the p-type metal oxide semiconductor may be formed on the insulator protection film layer formed on upper portions of the source electrode and the drain electrode.

A nitride semiconductor device of a twelfth aspect according to the present invention is the nitride semiconductor device of any one of the first aspect to the third aspect, wherein the first nitride semiconductor layer may be made of $Al_x1Ga_{1-x}N$ ($0 \leq x \leq 1$), and wherein the second nitride semiconductor layer may be made of $Al_xGa_{1-y-z}N$ ($0 \leq y \leq 1$, $0 \leq z \leq 1$).

A nitride semiconductor device of a thirteenth aspect according to the present invention is the nitride semiconductor device of any one of the first aspect to the third aspect, wherein the insulator protection film layer may be configured by forming an oxide insulator protection film layer on a nitride insulator protection film layer.

A nitride semiconductor device of a fourteenth aspect according to the present invention is the nitride semiconductor device of the thirteenth aspect, wherein the thickness of the oxide insulator protection film layer is equal to or greater than 1 nm and equal to or less than 50 nm, preferably.

A nitride semiconductor device of a fifteenth aspect according to the present invention is the nitride semiconductor device of any one of the first aspect to the third aspect, wherein a water repellent film layer may be formed in an interface between the insulator protection film layer and the gate electrode.

A nitride semiconductor device of a sixteenth aspect according to the present invention is the nitride semiconductor device of any one of the first aspect to the third aspect, wherein a fluorocarbon chain or a hydrocarbon chain may be formed in an interface between the insulator protection film layer and the gate electrode.

A method of manufacturing a nitride semiconductor device of a seventeenth aspect according to the present invention comprises steps of:

forming a nitride buffer layer on a substrate;

forming a first nitride semiconductor layer on the nitride buffer layer;

forming a second nitride semiconductor layer on the first nitride semiconductor layer, the second nitride semiconductor layer having an Al composition higher than the first nitride semiconductor layer;

forming a source electrode and a drain electrode on the second nitride semiconductor layer at a distance from each other;

forming an insulator protection film layer on the second nitride semiconductor layer including upper portions of the source electrode and the drain electrode;

forming an opening portion in the insulator protection film layer between the source electrode and the drain electrode;

forming a gate layer to cover the opening portion and at least a portion of the insulator protection film layer; and forming a gate electrode on the gate layer, wherein in the method of manufacturing the gate layer, the opening portion is configured to have a surface of the second nitride semiconductor layer and a surface of the insulator protection film layer, and wherein the step of forming the gate layer includes a water repellent film forming step of applying patterning through chemical modification with a water repellent film layer onto the insulator protection film layer except a region to be provided with the gate layer so as to selectively grow the gate layer by using an atomic layer deposition method.

A method of manufacturing a nitride semiconductor device of an eighteenth aspect according to the present invention comprises steps of:

forming a nitride buffer layer on a substrate;

forming a first nitride semiconductor layer on the nitride buffer layer;

forming a second nitride semiconductor layer on the first nitride semiconductor layer, the second nitride semiconductor layer having an Al composition higher than the first nitride semiconductor layer;

forming an insulator protection film layer on the second nitride semiconductor layer;

forming an opening portion in the insulator protection film layer, the opening portion having a bottom surface defined as a surface of the second nitride semiconductor layer;

forming a gate layer to cover the opening portion; and forming a gate electrode of a p-type metal oxide semiconductor on the gate layer, and removing the insulator protection film layer on both sides of the gate electrode to form a source electrode and a drain electrode at a distance from each other on the second nitride semiconductor layer by a self-alignment method using the gate layer and the gate electrode, wherein in the method of manufacturing the gate layer, the step of forming the gate layer includes a water repellent film forming step of applying patterning through chemical modification with a water repellent film layer onto the insulator protection film layer except a region to be provided with the gate layer so as to selectively grow the gate layer by using an atomic layer deposition method.

A method of manufacturing a nitride semiconductor device of a nineteenth aspect according to the present invention, in the seventeenth aspect or the eighteenth aspect, comprises a step of annealing in an oxygen atmosphere after formation of the gate layer, and wherein the gate layer is made of nickel oxide and has a hole concentration equal to or greater than $1 \times 10^{17}$ cm$^{-3}$ and equal to or less than $1 \times 10^{19}$ cm$^{-3}$, preferably.

A method of manufacturing a nitride semiconductor device of a twenty aspect according to the present invention is the method of manufacturing a nitride semiconductor device of the seventeenth aspect or the eighteenth aspect, wherein the water repellent film forming step may include a step of forming a water repellent film from a silane coupling agent having a fluorocarbon chain such as $CF_3 (CF_2)_7 C_2 H_4 SiCl_3$ or a hydrocarbon chain such as $CH_3 (CH_2)_{1\text{-}7} SiCl_3$.

According to a nitride semiconductor device and a method of manufacturing the nitride semiconductor device of the present invention configured as described above, a nitride semiconductor device having a normally-off characteristic and a reduced ON-resistance can be acquired.

(First Embodiment)

Figure 1A:
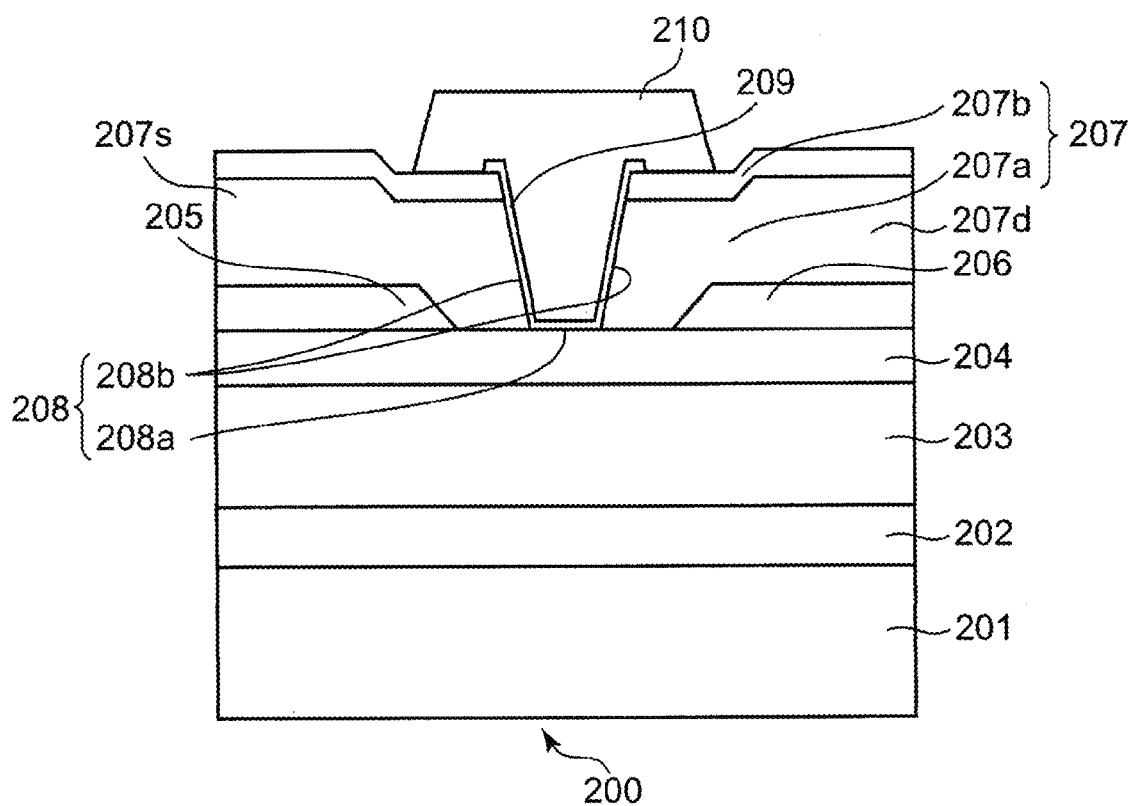
FIG. 1A is a cross-sectional view showing a structure of a nitride semiconductor device of a first embodiment according to the present invention.

A nitride semiconductor device and a method of manufacturing the same of a first embodiment according to the present invention will hereinafter be described with reference to the accompanying drawings. FIG. 1A is a cross-sectional view of a nitride semiconductor device 200 of the first embodiment according to the present invention.

The nitride semiconductor device 200 depicted in FIG. 1A includes a substrate 201, a nitride buffer layer 202, a first nitride semiconductor layer 203, a second nitride semiconductor layer 204, a source electrode 205, a drain electrode 206, an insulator protection film layer 207, a gate layer 209, and a gate electrode 210. An example of the nitride semiconductor device 200 is a hetero-junction field effect transistor (HFET). Constituent elements of the nitride semiconductor device 200 will hereinafter be described.

<Substrate 201>

Examples of a material of the substrate 201 are silicon, sapphire, and SiC.

If the material of the substrate 201 is sapphire or SiC, each layer of the nitride buffer layer 202, the first nitride semiconductor layer 203, and the second nitride semiconductor layer 204 described layer is formed by using a metal organic chemical vapor deposition (MOCVD).

The substrate 201 has a first surface and a second surface opposite to the first surface. The first surface of the substrate 201 is a surface in contact with the nitride buffer layer 202 described later.

<Nitride Buffer Layer 202>

The nitride buffer layer 202 is formed on the substrate 201.

When the nitride buffer layer 202 is epitaxially grown on the first surface of the substrate 201, a surface of the nitride buffer layer 202 in contact with the first surface of the substrate 201 has the crystal orientation aligned with the first surface of the substrate 201. For example, if the material of the substrate 201 is silicon and the first surface is a (111) surface, the surface of the nitride buffer layer 202 in contact with the substrate 201 is a (0001) surface. If the material of the substrate 201 is sapphire and the first surface is a (0001) surface, the surface of the nitride buffer layer 202 in contact with the substrate 201 is a (0001) surface.

Examples of a material of the nitride buffer layer 202 are AlN and AlGaN. The nitride buffer layer 202 may have a single layer structure of AlN or AlGaN, or may have a multilayer structure of AlN and AlGaN.

If silicon (Si) is used for the substrate 201, the nitride buffer layer 202 can relax a stress (warpage) inherent in the first nitride semiconductor layer 203 and the second nitride semiconductor layer 204 described later on the upper portion of the substrate 201.

The nitride buffer layer 202 can be formed in a multilayer structure of $Al_xGa_{1-x}N$ (0<x<1) to further relax the stress in the first nitride semiconductor layer 203 and the second nitride semiconductor layer 204 described later. The multilayer structure of $Al_xGa_{1-x}N$ (0<x<1) means that each layer is a layer with a different composition of Al or Ga.

<First Nitride Semiconductor Layer 203>

The first nitride semiconductor layer 203 is formed on the nitride buffer layer 202.

When the first nitride semiconductor layer 203 is epitaxially grown on the nitride buffer layer 202 epitaxially grown on the first surface of the substrate 201, a surface of the first nitride semiconductor layer 203 in contact with the nitride buffer layer 202 has the crystal orientation aligned with the first surface of the substrate 201. For example, if the material of the substrate 201 is silicon and the first surface is a (111) surface, the surface of the first nitride semiconductor layer 203 in contact with the nitride buffer layer 202 is a (0001) surface. If the material of the substrate 201 is sapphire and the first surface is a (0001) surface, the surface of the first nitride semiconductor layer 203 in contact with the nitride buffer layer 202 is a (0001) surface.

An example of a material of the first nitride semiconductor layer 203 is undoped GaN. As used herein, "undoped" means that impurities are not intentionally introduced. The first nitride semiconductor layer 203 is desirably has a thickness equal to or greater than 0.15 μm and equal to or less than 5 μm.

<Second Nitride Semiconductor Layer 204>

The second nitride semiconductor layer 204 is formed on the first nitride semiconductor layer 203.

The nitride buffer layer 202 and the first nitride semiconductor layer 203 are epitaxially grown in this order on the first surface of the substrate 201. When the second nitride semiconductor layer 204 is epitaxially grown on the epitaxially grown first nitride semiconductor layer 203, a surface of the second nitride semiconductor layer 204 in contact with the first nitride semiconductor layer 203 has the crystal orientation aligned with the first surface of the substrate 201. For example, if the material of the substrate 201 is silicon and the first surface is a (111) surface, the surface of the first nitride semiconductor layer 203 in contact with the nitride buffer layer 202 is a (0001) surface. If the material of the substrate 201 is sapphire and the first surface is a (0001) surface, the surface of the first nitride semiconductor layer 203 in contact with the nitride buffer layer 202 is a (0001) surface.

The material of the second nitride semiconductor layer 204 has a band gap larger than the material of the first nitride semiconductor layer 203 and has a lattice constant smaller than the first nitride semiconductor layer 203. An example of the material of the second nitride semiconductor layer 204 is $Al_xIn_yGa_{1-x-y}N$ (where 0≤x<1; b is 0≤y<1).

The second nitride semiconductor layer 204 is desirably has a thickness equal to or greater than 10 nm and equal to or less than 50 nm.

Figure 1B:
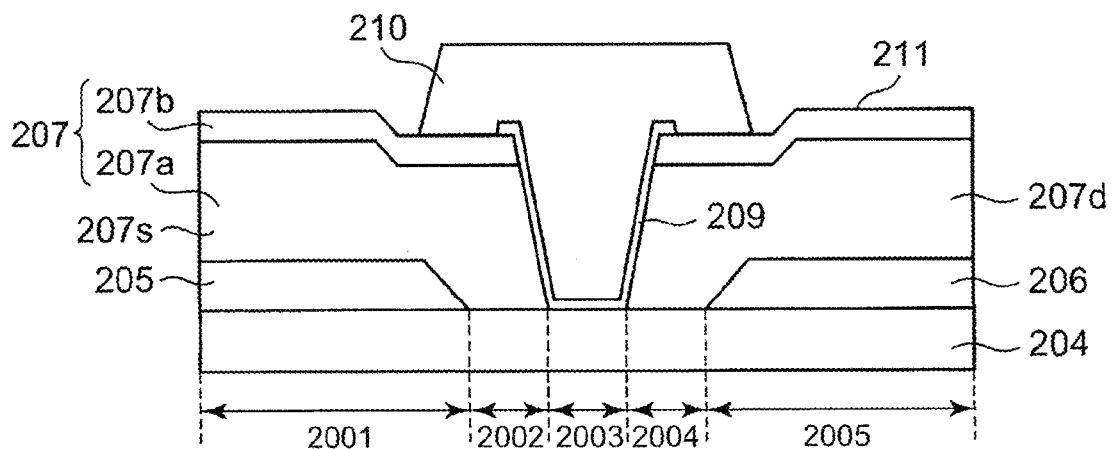
FIG. 1B is a cross-sectional view showing a part of the structure of the nitride semiconductor device of the first embodiment according to the present invention.

FIG. 1B depicts a cross-sectional view of the nitride semiconductor device 200. FIG. 1B is an enlarged diagram mainly depicting an upper side from the second nitride semiconductor layer 204 of FIG. 1A. In FIG. 1B, the substrate 201, the nitride buffer layer 202, and the first nitride semiconductor layer 203 unrelated to the description are not depicted.

As depicted in FIG. 1B, the second nitride semiconductor layer 204 is divided into a first region 2001, a second region 2002, a third region 2003, a fourth region 2004, and a fifth region 20005. In FIG. 1B, the first to fifth regions 2001 to 2005 are arranged in this order from the left.

Although details of the source electrode 205, the drain electrode 206, and the gate layer 209 will be described later, the positional relationships with the second nitride semiconductor layer 204 will first be described.

The first region 2001 in the second nitride semiconductor layer 204 is a region having the upper surface including a surface in contact with the source electrode 205. Specifically, when a film thickness direction of the second nitride semiconductor layer 204 (an up-down direction of FIG. 1B) is defined as an up-down direction, the first region 2001 includes a region under the surface in contact with the source electrode 205. In the same way, the second to fifth regions 2002 to 2005 following the first region 2001 include regions under the respective upper surfaces of the second to fifth regions 2002 to 2005 depicted in FIG. 1B in the film thickness direction of the second nitride semiconductor layer 204 (the up-down direction of FIG. 1B). The "thickness direction of the second nitride semiconductor layer 204" has almost the same meaning as the direction perpendicular to the first surface of the substrate 201.

The second region 2002 and the fourth region 2004 are regions having the upper surfaces in contact with the insulator protection film layer 207. The third region 2003 is a region having the upper surface in contact with the gate layer 209. The fifth region 2005 is a region having the upper surface in contact with the drain electrode 206.

The second region 2002, the third region 2003, and the fourth region 2004 in the second nitride semiconductor layer 204 desirably have the same thickness. As used herein, the "same thickness" means that thicknesses having a difference to the extent of a minimum controllable thickness of an apparatus forming the second nitride semiconductor layer 204 are considered as the same thicknesses. For example, the controllable thickness is several nm.

The second region 2002, the third region 2003, and the fourth region 2004 of the second nitride semiconductor layer 204 are desirably made of a material having the same composition.

As used herein, the "same composition" means that compositions having a difference to the extent of a minimum controllable composition of an apparatus forming the second nitride semiconductor layer 204 are considered as the same compositions.

When the second region 2002, the third region 2003, and the fourth region 2004 in the second nitride semiconductor layer 204 have the same thickness and Al composition, the second nitride semiconductor layer 204 can be formed without reducing the two-dimensional electron gas (2DEG) concentration.

<Source Electrode 205 and Drain Electrode 206>

The source electrode 205 and the drain electrode 206 are formed on the second nitride semiconductor layer 204 and separated at a distance from each other. The source electrode 205 and the drain electrode 206 are formed separately from the gate layer 209 described later.

The source electrode 205 is in contact with the first region 2001 of the second nitride semiconductor layer 204. The drain electrode 206 is in contact with the fifth region 2005 of the second nitride semiconductor layer 204.

The source electrode 205 and the drain electrode 206 have a layered structure formed by stacking films of respective materials of titanium (Ti), aluminum (Al), and hafnium (Hf), for example. The source electrode 205 and the drain electrode 206 are desirably made of a material with a low contact resistance. For example, vanadium (V) or zirconium (Zr) may be used instead of hafnium (Hf).

Preferably, the source electrode 205 and the drain electrode 206 desirably have a thickness equal to or greater than 20 nm and equal to or less than 500 nm. The source electrode 205 and the drain electrode 206 more desirably have a thickness equal to or greater than 40 nm and equal to or less than 200 nm.

The source electrode 205 and the drain electrode 206 are desirably formed at a distance of 5 μm or less and separated from each other. The distance of 5 μm or less does not include 0 μm.

<Insulator Protection Film Layer 207>

The insulator protection film layer 207 is formed at least partially covering each of the source electrode 205, the drain electrode 206, and the second nitride semiconductor layer 204.

The insulator protection film layer 207 covers the surfaces of the second region 2002 and the fourth region 2004 of the second nitride semiconductor layer 204.

The insulator protection film layer 207 at least partially covers the source electrode 205. The insulator protection film layer 207 is opposite to the first region 2001 of the second nitride semiconductor layer 204 across the source electrode 205.

The insulator protection film layer 207 at least partially covers the drain electrode 206. The insulator protection film layer 207 is opposite to the fifth region 2005 of the second nitride semiconductor layer 204 across the drain electrode 206.

The insulator protection film layer 207 is not formed on a surface of the third region 2003 of the second nitride semiconductor layer 204 and therefore is not in a shape of a uniform film. The insulator protection film layer 207 is made up of a region formed on an upper portion of the source electrode 205 and an upper portion of the second region 2002 as well as a region formed on an upper portion of the drain electrode 206 and an upper portion of the fourth region 2004, and the regions may have respective divided shapes. The insulator protection film layer 207 may have a concave portion (an opening portion) surrounded by the region formed on the upper portion of the source electrode 205 and the upper portion of the second region 2002 as well as the region formed on the upper portion of the drain electrode 206 and the upper portion of the fourth region 2004.

As depicted in FIG. 1B, the region surrounded by a bottom surface 208a made up of an upper surface of the second nitride semiconductor layer 204 and a side surface 208b made up of the insulator protection film layer 207 is also referred to as an opening portion 208.

Therefore, the insulator protection film layer 207 is not formed in the region corresponding to the opening portion 208. In particular, on the upper surface of the second nitride semiconductor layer 204, the insulator protection film layer 207 is not formed in the region where the opening portion 208 is formed, and the gate layer 209 described later is formed in direct contact with the upper surface of the second nitride semiconductor layer 204.

In the insulator protection film layer 207, side surfaces in contact with the source electrode 205 and the drain electrode 206 will be referred to as external side surfaces, and side surfaces in contact with the gate layer 209 in regions formed on the upper portions of the second region 2002 and the fourth region 2004 will be referred to as internal side surfaces.

Examples of the material of the insulator protection film layer 207 are silicon nitride ($SiN_x$), silicon oxide ($SiO_x$), MN, etc. The insulator protection film layer 207 has a single layer structure or a multilayer structure.

The insulator protection film layer 207 is in direct contact with the second region 2002 and the fourth region 2004 of the second nitride semiconductor layer 204 and therefore reduces a surface level formed in the second region 2002 and the fourth region 2004.

A two-dimensional electron gas (2DEG) layer is formed in an interface between the first nitride semiconductor layer 203 and the second nitride semiconductor layer 204 formed under the second region 2002 and the fourth region 2004 of the second nitride semiconductor layer 204. The carrier concentration of the 2DEG layer can be increased by the reduction of the surface level and, therefore, the ON-resistance of the nitride semiconductor device 200 can be reduced.

The insulator protection film layer 207 formed on the second region 2002 and the fourth region 2004 of the second nitride semiconductor layer 204 acts as a dielectric film when a positive voltage is applied to the gate electrode 210 described later. As a result, the carrier concentration can be increased in the 2DEG layer formed in the interface between the first nitride semiconductor layer 203 under the second region 2002 and the fourth region 2004 of the second nitride semiconductor layer 204 and the second nitride semiconductor layer 204 and, therefore, the ON-resistance can be reduced.

The insulator protection film layer 207 desirably has a thickness equal to or greater than 10 nm and equal to or less than 200 nm.

Preferably, the insulator protection film layer 207 includes a nitride insulator protection film layer 207a formed at least partially covering the source electrode 205 and the drain electrode 206 on the second nitride semiconductor layer 204, and an oxide insulator protection film layer 207b formed on the nitride insulator protection film layer 207a. The insulator protection film layer 207 has the nitride insulator protection film layer 207a and therefore contributes to an improvement in adhesion to the second nitride semiconductor layer 204. The nitride insulator protection film layer 207a contributes to a concentration increase of the 2DEG layer. The oxide insulator protection film layer 207b contributes to an improvement in adhesion to a water repellent film layer 211 described later.

The thickness of the oxide insulator protection film layer 207b less than 1 nm deteriorates the adhesion to the water repellent film layer 211 described later, while the thickness greater than 50 nm deteriorates the adhesion to the nitride insulator protection film layer 207a. Therefore, the oxide insulator protection film layer 207b desirably has a thickness equal to or greater than 1 nm and equal to or less than 50 nm.

Since the nitride semiconductor device of the first embodiment is configured such that the gate layer 209 is in direct contact with the third region 2002 (sic) of the second nitride semiconductor layer 204, the insulator protection film layer 207 is divided into a source-electrode-side insulator protection film layer (source electrode forming region) 207s and a drain-electrode-side insulator protection film layer (drain electrode forming region) 207d by the gate layer 209.

Therefore, the insulator protection film layer 207 has the source-electrode-side insulator protection film layer 207s disposed in the forming region of the source electrode 205 on the second nitride semiconductor layer 204 and formed partially covering the source electrode, and the drain-electrode-side insulator protection film layer 207d disposed separately from the source-electrode-side insulator protection film layer 207s on the second nitride semiconductor layer 204 and formed partially covering the drain electrode. The gate layer 209 is formed in contact with the second nitride semiconductor layer 204 between the source-electrode-side insulator protection film layer 207s and the drain-electrode-side insulator protection film layer 207d so as to separate the layers from each other. The gate layer is made of a p-type semiconductor.

The gate layer 209 includes regions opposite to the second nitride semiconductor layer 204 across the source-electrode-side insulator protection film layer 207s (the region 2002 and the region 2004) and the drain-electrode-side insulator protection film layer 207d and a region in contact with the second nitride semiconductor layer 204 (the region 2003).

As depicted in FIG. 1A, the gate electrode 210 is formed covering the entire upper surface of the gate layer 209 and at least partially covering the insulator protection film layer 207. The upper surface of the gate layer 209 is a surface on the upper side of FIG. 1A and is a surface on the side opposite to the substrate 201 on the lower side. In this description, a direction orthogonal to the first surface of the substrate 201 is described as the up-down direction.

<Water Repellent Film Layer 211>

The water repellent film layer 211 may be formed at least partially on the upper portion of the insulator protection film layer 207. For example, the water repellent film layer 211 is formed opposite to the first region 2001, the second region 2002, the fourth region 2004, and the fifth region 2005 across the insulator protection film layer 207, the source electrode 205 and the drain electrode 206 on the upper portion of the insulator protection film layer 207.

The gate layer 209 is difficult to form on the upper portion of the insulator protection film layer 207 where the water repellent film layer 211 is formed. Therefore, the water repellent film layer 211 can be formed to control the position at which the gate layer 209 is formed.

The water repellent film layer 211 can coat the surface of the upper portion of the insulator protection film layer 207 through chemical adsorption or physical adsorption. Examples of the material of the water repellent film layer 211 are $CF_3 (CF_2)_7 C_2 H_4 SiCl_3$ and $CH_3 (CH_2)_{1\ 7} SiCl_3$. The water repellent film layer 211 is a silane coupling agent having a fluorocarbon chain such as $CF_3 (CF_2)_7 C_2 H_4 SiCl_3$ or a hydrocarbon chain.

The water repellent film layer 211 desirably has a water repellent property with a contact angle of 100 degrees or more between the water repellent film layer 211 and water ($H_2O$).

<Gate Layer 209>

The gate layer 209 is formed in contact with an upper surface of the second nitride semiconductor layer 204 in the region between the source electrode 205 and the drain electrode 206 and is electrically separated (insulated) from the source electrode 205 and the drain electrode 206.

The gate layer 209 has a region in contact with the surface of the third region 2003 in the second nitride semiconductor layer 204.

The gate layer 209 opposite to the second region 2002 and the fourth region 2004 of the second nitride semiconductor layer 204 is formed across the insulator protection film layer 207 in the film thickness direction (the up-down direction of FIG. 1B) of the second nitride semiconductor layer 204. In the regions of the insulator protection film layer 207 opposite to the second region 2002 and the fourth region 2004 of the second nitride semiconductor layer 204 in the up-down direction, the gate layer 209 has a region in contact with the side surface 208b of the insulator protection film layer 207 and a region in contact with the upper surface of the insulator protection film layer 207. As depicted in FIG. 1B, the insulator protection film layer 207 is formed between the source electrode 205/the drain electrode 206 and the gate layer 209 and between the source electrode 205/the drain electrode 206 and the gate electrode 210 described later. An example of the material of the gate layer 209 is a p-type metal oxide semiconductor.

As described above, the gate layer 209 is formed opposite to the second region 2002 and the fourth region 2004 of the second nitride semiconductor layer 204 in the up-down direction. Therefore, the gate layer 209 is increased by the regions (the second region 2002 and the fourth region 2004) opposite to the second nitride semiconductor layer 204 as compared to the case of having only the region (the third region 2003) in contact with the second nitride semiconductor layer 204.

When a positive voltage is applied to the gate electrode 210 described later, the carrier concentration can be increased in the 2DEG layer formed in the interface between the first nitride semiconductor layer 203 under the second region 2002 and the fourth region 2004 of the second nitride semiconductor layer 204, and the second nitride semiconductor layer 204. As a result, the nitride semiconductor device 200 of the first embodiment can significantly reduce the ON-resistance as compared to a nitride semiconductor device having only the gate layer made up only of the region in contact with the second nitride semiconductor layer 204.

By using the p-type metal oxide semiconductor for the gate layer 209 in the nitride semiconductor device 200 of the first embodiment, a potential can be made higher in the 2DEG layer formed in the interface between the first nitride semiconductor layer 203 and the second nitride semiconductor layer 204 formed under the third region 2003 of the second nitride semiconductor layer 204 in the film thickness direction (up-down direction) of the second nitride semiconductor layer 204, so as to deplete the electrons of the 2DEG layer. To acquire the normally-off characteristic in the nitride semiconductor device 200, the potential of the 2DEG layer must be formed at a position higher than the Fermi level.

The potential height of the 2DEG layer can be controlled by the hole concentration of the gate layer 209 and the carrier concentration of the 2DEG layer. The carrier concentration of the 2DEG layer is determined by the Al composition and the film thickness of the second nitride semiconductor layer 204. The carrier concentration of the 2DEG layer calculated from spontaneous polarization and piezoelectric polarization can be controlled from $7 \times 10^{11}$ $cm^{-2}$ to $6 \times 10^{13}$ $cm^{-2}$ by the Al composition. To control the potential of the 2DEG layer, the hole concentration is desirably equal to or greater than $5 \times 10^{15}$ $cm^{-3}$. In general, it is difficult to form the p-type metal oxide semiconductor having the hole concentration greater than $1 \times 10^{19}$ $cm^{-3}$. The hole concentration of the p-type metal oxide semiconductor is desirably equal to or greater than $5 \times 10^{15}$ $cm^{-3}$ and equal to or less than $1 \times 10^{19}$ $cm^{-3}$. To form the potential of the 2DEG layer at a position higher than the Fermi level to acquire the normally-off characteristic, the hole concentration is desirably equal to or greater than $3\times10^{18}$ cm$^{-3}$ and equal to or less than $1\times10^{19}$ cm$^{-3}$.

The hole concentration can be controlled by doping with an alkali metal, for example, lithium, sodium, potassium, rubidium, and cesium. A hole-concentration control doping concentration is desirably equal to or greater than $1\times10^{17}$ cm$^{-3}$ enabling the formation of a shallow impurity level at which the normally-off characteristic can be acquired. If the hole-concentration control doping concentration is high, a gate current becomes large and, therefore, the concentration is desirably equal to or less than $1\times10^{21}$ cm$^{-3}$. The hole-concentration control doping concentration is desirably equal to or greater than $1\times10^{17}$ cm$^{-3}$ and equal to or less than $1\times10^{21}$ cm$^{-3}$.

The hole concentration of the p-type metal oxide semiconductor can be adjusted by cation atom deficiency or oxygen concentration control.

If the thickness of the gate layer 209 using the p-type metal oxide semiconductor is less than 30 nm, the normally-off characteristic cannot favorably be acquired and, if the thickness is greater than 200 nm, a switching characteristic deteriorates. Therefore, the gate layer 209 is desirably has a thickness equal to or greater than 30 nm and equal to or less 200 nm.

<Gate Electrode 210>

The gate electrode 210 is formed covering a portion of the upper surface of the insulator protection film layer 207 and the entire upper surface of the gate layer 209.

Examples of the material of the gate electrode 210 are chromium (Cr), nickel (Ni), palladium (Pd), gold (Au), and platinum (Pt). The gate electrode 210 must achieve an ohmic property with the gate layer 209.

The gate electrode 210 can be formed in a single layer or layered structure. The gate electrode 210 desirably has a thickness equal to or greater than 20 nm and equal to or less than 1000 nm. Moreover, the gate electrode 210 desirably has a thickness equal to or greater than 40 nm and equal to or less than 500 nm.

<Manufacturing Method>

A method of manufacturing an HFET defined as the nitride semiconductor device 200 according to the first embodiment will hereinafter be described with reference to FIG. 2. In FIG. 2, (a) to (d) depict the method of manufacturing the HFET with time.

First, as depicted in (a) of FIG. 2, a crystal growing apparatus is used for sequentially growing the nitride buffer layer 202, the first nitride semiconductor layer 203, and the second nitride semiconductor layer 204 each made of a nitride semiconductor on the substrate 201 made of silicon, for example.

Specifically, for example, the first surface of the substrate 201 made of silicon is washed by buffered hydrogen fluoride to remove a natural oxide film on the first surface. The substrate 201 is then introduced into the crystal growing apparatus. The crystal growing apparatus is desirably an apparatus capable of growing a high-quality nitride semiconductor and can use a molecular beam epitaxy (MBE) method, a metal-organic vapor phase epitaxy (MOVPE) or metal-organic chemical vapor deposition (MOCVD) method, or a hydride vapor phase epitaxy (HVPE) method. In this description, the MOCVD method is taken as an example.

The nitride buffer layer 202 is formed by the crystal growing apparatus. The nitride buffer layer 202 may be any nitride semiconductor made of $Al_xGa_{1-x}N$ (0<x<1). In the first embodiment, aluminum nitride (AlN) and aluminum gallium nitride (AlGaN) are used for the nitride buffer layer 202. After forming an AlN layer to, for example, a thickness of 0.16 μm, an $Al_{0.5}Ga_{0.5}N$ layer is formed to, for example, a thickness of 0.2 μm.

On the nitride buffer layer 202, an undoped GaN layer is formed as the first nitride semiconductor layer 203 to a thickness of 500 nm, for example.

On the first nitride semiconductor layer 203, an undoped $Al_{0.3}Ga_{0.7}N$ layer is formed as the second nitride semiconductor layer 204 to a thickness of about 15 nm, for example.

After the nitride semiconductor layers described above are sequentially grown, the substrate 201 is taken out from the crystal growing apparatus.

As depicted in (b) of FIG. 2, a lithography method is used for patterning and forming a resist film (not depicted) having openings at portions above the forming regions of the source electrode 205 and the drain electrode 206.

A deposition apparatus is used for forming ohmic electrode metals made of, for example, Ti, Al, and Hf to 20 nm, 400 nm, and 20 nm, respectively, on the resist film including the second nitride semiconductor layer 204 exposed from the resist film. Subsequently, the resist film and the unnecessary portions of the ohmic electrode metal films on the resist film are removed by a lift-off method to form the source electrode 205 and the drain electrode 206.

The insulator protection film layer 207 is formed entirely on the source electrode 205 and the drain electrode 206 including the second nitride semiconductor layer 204. The insulator protection film layer 207 is made of silicon nitride ($SiN_x$) and silicon oxide ($SiO_x$), for example, and has a two-layer structure of 200 nm and 10 nm, respectively.

A forming apparatus of the insulator protection film layer 207 is desirably an apparatus capable of growing the high-quality insulator protection film layer 207 and can use the MBE method, the MOVPE or MOCVD method, or a plasma CVD (PCVD) method, a sputtering method. Plasma CVD is the most excellent in suppression of current collapse and reduction of ON-resistance.

As depicted in (c) of FIG. 2, a lithography method is used for patterning and forming a resist film (not depicted) masking the forming region of the gate layer 209 between the source electrode 205 and the drain electrode 206. A portion of the forming region of the gate layer is selectively etched by etching. As a result, the opening portion 208 is formed that is surrounded by the bottom surface 208a made up of the upper surface of the second nitride semiconductor layer 204 and the side surface 208b of the insulator protection film layer 207. The resist film is subsequently removed.

With regard to the etching of the insulator protection film layer 207, the opening portion 208 can be formed by dry etching using a gas or wet etching associated with ultraviolet irradiation using buffered hydrogen fluoride or a potassium hydroxide solution. For example, the opening 208 can be formed by a lithography method and a dry etching method using inductive coupled plasma (ICP) etc. using a tetrafluoromethane ($CF_4$) gas, a trifluoromethane ($CHF_3$) gas, and an oxygen gas as an etching gas.

As depicted in (c) of FIG. 2, the water repellent film layer 211 made of perfluorooctylethyltrichlorosilane ($CF_3(CF_2)_7C_2H_4SiCl_3$) is formed on the insulator protection film layer 207 and the opening portion 208.

The water repellent film layer 211 is removed only from the forming portion of the gate layer 209. The water repellent film layer 211 may be removed only from the region of the forming portion of the gate layer 209, and the water repellent film layer 211 on the other regions may be left until the subsequent step. With regard to the removal of the water repellent film layer 211, for example, the water repellent film layer 211 can be removed by applying an electron beam (EB), or ozone or oxygen plasma in a heated state. The water repellent film layer 211 can also be removed by using an alkali solution.

To reduce the ON-resistance, a gate length is desirably short and is preferably equal to or less than 2 μm, more preferably equal to or less than 1 μm.

As depicted in (d) of FIG. 2, the gate layer 209 is formed in contact with the insulator protection film layer 207 and the opening portion 208. The gate layer 209 may be any p-type metal oxide semiconductor layer and, for example, NiO is formed into the gate layer 209 to a thickness of 100 nm. The p-type metal oxide semiconductor can be formed only in the opening portion 208.

The p-type metal oxide semiconductor layer is preferably formed by using an atomic layer deposition (ALD) method. By using the ALD method, the layer can selectively be grown except the region patterned by using the water repellent film. By using the ALD method, the p-type metal oxide semiconductor layer can easily be acquired at a hole concentration higher than AlGaN to which conventional p-type impurities are added. To increase the hole concentration of the p-type metal oxide semiconductor layer, annealing can be applied after the formation of the p-type metal oxide semiconductor layer.

A lithography method is used for patterning and forming a resist film (not depicted) having an opening at a portion above the forming region of the gate electrode 210.

A deposition apparatus is used for forming a p-side ohmic electrode metal film on the resist film including the gate layer 209 exposed from the resist film. Subsequently, the resist film and the unnecessary portions of the p-side ohmic electrode metal film on the resist film are removed by a lift-off method to form the gate electrode 210.

The insulator protection film layer 207 and the gate layer 209 are partially removed by dry etching to form an opening to allow contact with the source electrode 205 and the drain electrode 206. The opening may be formed in any manner to allow contact with the source electrode 205 and the drain electrode 206 and may be formed by wet etching using hydrofluoric acid.

The manufacturing method described above enables the manufacturing of the hetero-junction field effect transistor (HFET) described in the first embodiment.

Figure 3:
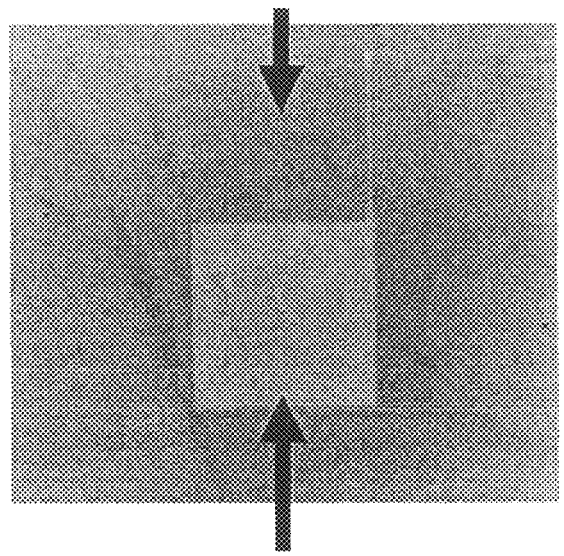
FIG. 3 is a diagram showing an optical microscope photograph which shows a NiO selective growth performed by patterning of a water repellent film patterning in the method of manufacturing the nitride semiconductor device of the first embodiment according to the present invention.

FIG. 3 depicts an optical microscope photograph when the gate layer 209 is patterned by using a water repellent film made of CF$_3$ (CF$_2$)$_7$ C$_2$ H$_4$ SiCl$_3$) and the NiO selective growth is performed by the ALD method in the first embodiment. It is found that NiO can selectively be grown on a region where the water repellent film is not formed.

Figure 4:
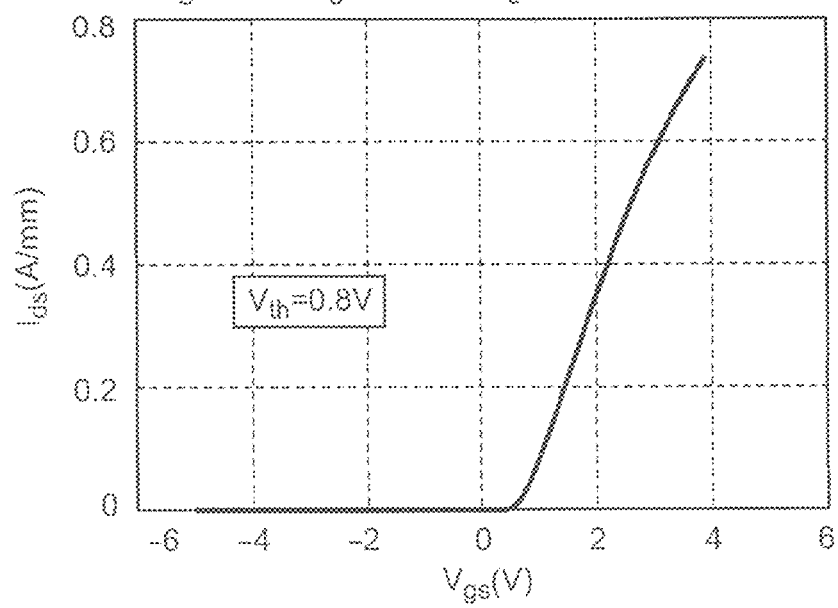
FIG. 4 is a diagram showing a relationship between a gate-source voltage $V_{gs}$ and a drain-source current $I_{ds}$.

FIG. 4 depicts a relationship between a gate-source voltage V$_{gs}$ and a drain-source current I$_{ds}$ of the nitride semiconductor layer of the nitride semiconductor device annealed in an oxygen atmosphere at 400° C. for 30 minutes after the gate layer 209 made of NiO is formed in the first embodiment. From the I$_{ds}$-V$_{gs}$ measurement result of FIG. 4, favorable transistor characteristics are acquired such that a current flows for I$_{ds}$ when a positive bias is applied to V$_{gs}$. The normally-off characteristic with a threshold voltage (V$_{th}$) of 0.8 V is acquired along with the ON-resistance of 2.54 Ωmm. Therefore, it is found that the normally-off characteristic and the low ON-resistance can be satisfied at the same time.

Figure 5:
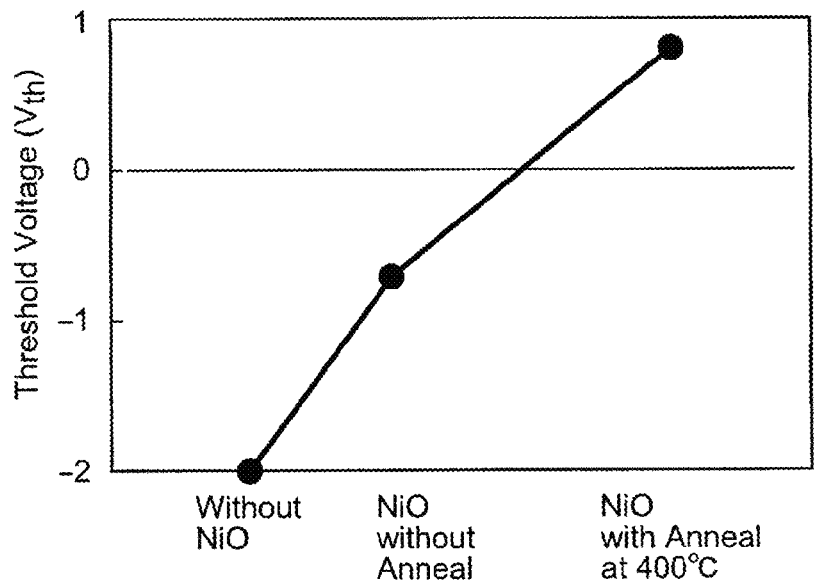
FIG. 5 is a diagram showing a relationship between a method of forming a gate layer and a threshold voltage.

FIG. 5 depicts a relationship between a method of forming the gate layer 209 and the threshold voltage (V$_{th}$) of a nitride semiconductor device (NiO with Anneal at 400° C.) annealed in an oxygen atmosphere at 400° C. for 30 minutes after the gate layer 209 made of NiO is formed in the first embodiment, a nitride semiconductor device (NiO without Anneal) that is not annealed, and a nitride semiconductor device (without NiO) with a Schottky structure using the gate layer 209 made of 200 nm of Ni metal. From FIG. 5, V$_{th}$ is −2 V in the nitride semiconductor device (without NiO) using the Ni metal as the gate layer 209, and V$_{th}$ is −1 V in the nitride semiconductor device (NiO without Anneal) that is not annealed after the formation of the gate layer 209. V$_{th}$ is 0.8 V in the nitride semiconductor device (NiO with Anneal at 400° C.) annealed in an oxygen atmosphere after the formation of the gate layer 209 made of NiO. It is found that the normally-off characteristic is acquired by annealing in an oxygen atmosphere at 400° C. for 30 minutes after the gate layer 209 made of NiO is formed. As a result, it is found that the hole concentration of NiO is increased by annealing in an oxygen atmosphere.

Figure 6:
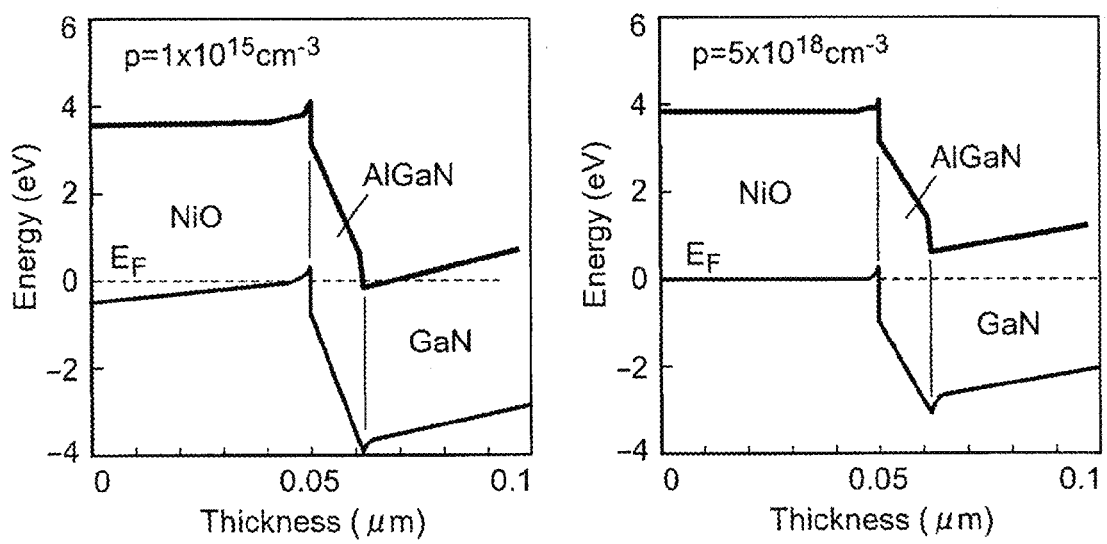
FIG. 6 is diagrams showing energy diagrams from calculations for a hole concentration of NiO.

FIG. 6 is energy diagrams from calculations for a hole concentration when NiO is used for the gate layer 209. In the energy diagrams of FIG. 6, assuming that the first nitride semiconductor layer 203 is made of GaN with a film thickness of 500 nm, that the second nitride semiconductor layer 204 is made of Al$_{0.3}$Ga$_{0.7}$N with a film thickness of 15 nm, and that the gate layer 209 is made of NiO with a film thickness of 50 nm, the potential position of the 2DEG layer is calculated when the hole concentration of NiO is changed. When the hole concentration is 5×10$^{15}$ cm$^{-3}$, the potential of the 2DEG layer formed by the first nitride semiconductor layer 203 and the second nitride semiconductor layer 204 is −0.2 V relative to the Fermi level (E$_F$). As a result, it is found that the potential of the 2DEG layer cannot be made higher than the Fermi level, leading to a normally-on state. When the hole concentration is 5×10$^{18}$ cm$^{-3}$, the potential of the 2DEG layer formed by the first nitride semiconductor layer 203 and the second nitride semiconductor layer 204 is 0.8 V relative to the Fermi level (E$_F$). It is found that when the hole concentration is equal to or greater than 3×10$^{18}$ cm$^{-3}$, the potential of the 2DEG layer indicates 0 V or higher relative to the Fermi level (E$_F$). From this calculation result, it is found that when the hole concentration is equal to or greater than 3×10$^{18}$ cm$^{-3}$, the carrier of the 2DEG layer can be depleted to achieve a normally-off state. From this calculation result, it is also found that the hole concentration of the NiO increases to 3×10$^{18}$ cm$^{-3}$ or higher when the gate layer 209 is annealed in an oxygen atmosphere.

As described above, by using the method of manufacturing a nitride semiconductor device of the first embodiment according to the present invention, the nitride semiconductor device can be manufactured that can achieve both a configuration having a normally-off characteristic and a configuration capable of reducing an ON-resistance at the same time.

(Second Embodiment)

A nitride semiconductor device and a method of manufacturing the same of a second embodiment according to the present invention will hereinafter be described with reference to the accompanying drawings. FIG. 7 is a cross-sectional view of a nitride semiconductor device 300 of the second embodiment according to the present invention.

In the following description of the nitride semiconductor device 300 of the second embodiment, the same names are used for those having substantially the same meaning as in the nitride semiconductor device 200 of the first embodiment, and the constituent elements having the same functions are denoted by reference numerals of 300s to which the last two digits of the same reference numerals are added.

As depicted in FIG. 7, a hetero junction field effect transistor (HFET) is the nitride semiconductor device 300 of the second embodiment and has nitride semiconductors of a nitride buffer layer 302, a first nitride semiconductor layer 303, and a second nitride semiconductor layer 304 formed in this order on a first surface of a substrate 301.

A source electrode 305 and a drain electrode 306 are ohmic electrodes and formed on the second nitride semiconductor layer 304. An insulator protection film layer 307 is formed on the second nitride semiconductor layer 304 between the source electrode 305 and the drain electrode 306, separately from each of the electrodes. A gate layer 309 is formed on the second nitride semiconductor layer 304, dividing the insulator protection film layer 307 into two pieces on the source electrode side and the drain electrode side. As depicted in FIG. 7, the gate layer 309 is formed on the insulator protection film layer 307. A gate electrode 310 is formed covering the gate layer 309 and the insulator protection film layer 307.

In FIG. 7, in a direction substantially perpendicular to the first surface of the substrate 301 (the upper surface of the substrate 301 of FIG. 7), the second nitride semiconductor layer 304 has a first region 3001 having a surface formed in contact with the source electrode 305, a second region 3002 between the surface in contact with the source electrode 305 and a surface in contact with the gate layer 309, a third region 3003 having a surface formed in contact with the gate layer 309, a fourth region 3004 between the surface in contact with the gate layer 309 and a surface in contact with the drain electrode 306, and a fifth region 3005 having the surface formed in contact with the drain electrode 306.

As depicted in FIG. 7, the insulator protection film layer 307 is formed with a space separately from the source electrode 305 and the drain electrode 306 and is formed above the second region 3002 and the fourth region 3004 of the second nitride semiconductor layer 304. The second nitride semiconductor layer 304 has a constant film thickness at least from the second region 3002 to the fourth region 3004 and is formed with an Al composition.

The gate layer 309 is formed in contact with the insulator protection film layer 307 via the insulator protection film layer 307 on the second region 3002 and the fourth region 3004 of the second nitride semiconductor layer 304. In the third region 3003 of the second nitride semiconductor layer 304, the gate layer 309 is formed on the second nitride semiconductor layer 304 and in contact with the second nitride semiconductor layer 304. Therefore, the insulator protection film layer 307 is divided into two pieces of a source electrode side 307s and a drain electrode side 307d by the gate layer 309. The gate layer 309 is made of a p-type metal oxide semiconductor.

A method of manufacturing an HFET defined as the nitride semiconductor device of the second embodiment configured as described above will be described with reference to FIG. 8. In the HFET of the second embodiment, the constituent members substantially the same as the constituent members of the HFET defined as the nitride semiconductor device of the first embodiment will not be described.

FIG. 8 is diagrams for explaining a method of manufacturing the HFET that is the nitride semiconductor device of the second embodiment. In FIG. 8, (a) to (d) depict the method of manufacturing the HFET with time.

First, as depicted in (a) of FIG. 8, a crystal growing apparatus such as a MOCVD apparatus is used as is the case with the first embodiment for sequentially growing the nitride buffer layer 302, the first nitride semiconductor layer 303, and the second nitride semiconductor layer 304 made of a nitride semiconductor on the substrate 301.

The insulator protection film layer 307 is formed entirely on the second nitride semiconductor layer 304. The insulator protection film layer 307 is made of silicon nitride ($SiN_x$) and silicon oxide ($SiO_x$), for example, and has a two-layer structure of 200 nm and 10 nm, respectively.

As depicted in (b) of FIG. 8, a lithography method is used for patterning and forming a resist film (not depicted) masking the forming region of the gate layer 309. The forming region of the gate layer 309 is selectively etched by etching to form an opening portion 308 until reaching the second nitride semiconductor layer 304. The resist film is subsequently removed.

A water repellent film layer 311 made of perfluorooctylethyltrichlorosilane ($CF_3$ $(CF_2)_7$ $C_2$ $H_4$ $SiCl_3$) is formed on the insulator protection film layer 307 and the opening portion 308.

The water repellent film layer 311 is removed only from the forming portion of the gate layer 309. For example, the water repellent film layer 311 is removed by an electron beam (EB).

As depicted in (c) of FIG. 8, the gate layer 309 is formed on the insulator protection film layer 307 and the opening portion 308.

As depicted in (d) of FIG. 8, a lithography method is used for patterning a resist film (not depicted) having openings at portions above the forming regions of the source electrode 305 and the drain electrode 306 on the second nitride semiconductor layer 304. A dry etching apparatus is used for opening the insulator protection film layer 307 until reaching the second nitride semiconductor layer 304. In this case, the insulator protection film layer 307 is etched to the inside of the gate electrode 310 as depicted in FIG. 7.

A deposition apparatus is used for forming the source electrode 305 and the drain electrode 306 by a self-alignment method using the gate electrode 310 as a mask. By using the self-alignment method, the steps of patterning the source/drain electrodes can be reduced. For example, titanium (Ti) and aluminum (Al) can be used for the ohmic electrode metal films. A normal-line deposition apparatus or a rotation/revolution type deposition apparatus is desirably used for the deposition device.

The manufacturing method described above enables the manufacturing of a high electron mobility transistor (HEMT) that is the HFET of the second embodiment. Since the source/drain electrodes can be formed by using the self-alignment method in the HEMT according to the second embodiment, the HEMT can be manufactured with a reduced distance between the source/drain electrodes. Therefore, the ON-resistance can further be reduced in the HEMT according to the second embodiment. In the HEMT according to the second embodiment, as is the case with the HFET according to the first embodiment, both a configuration having the normally-off characteristic and a configuration achieving the reduction in the ON-resistance can be achieve at the same time.

(Third Embodiment)

Figure 9:
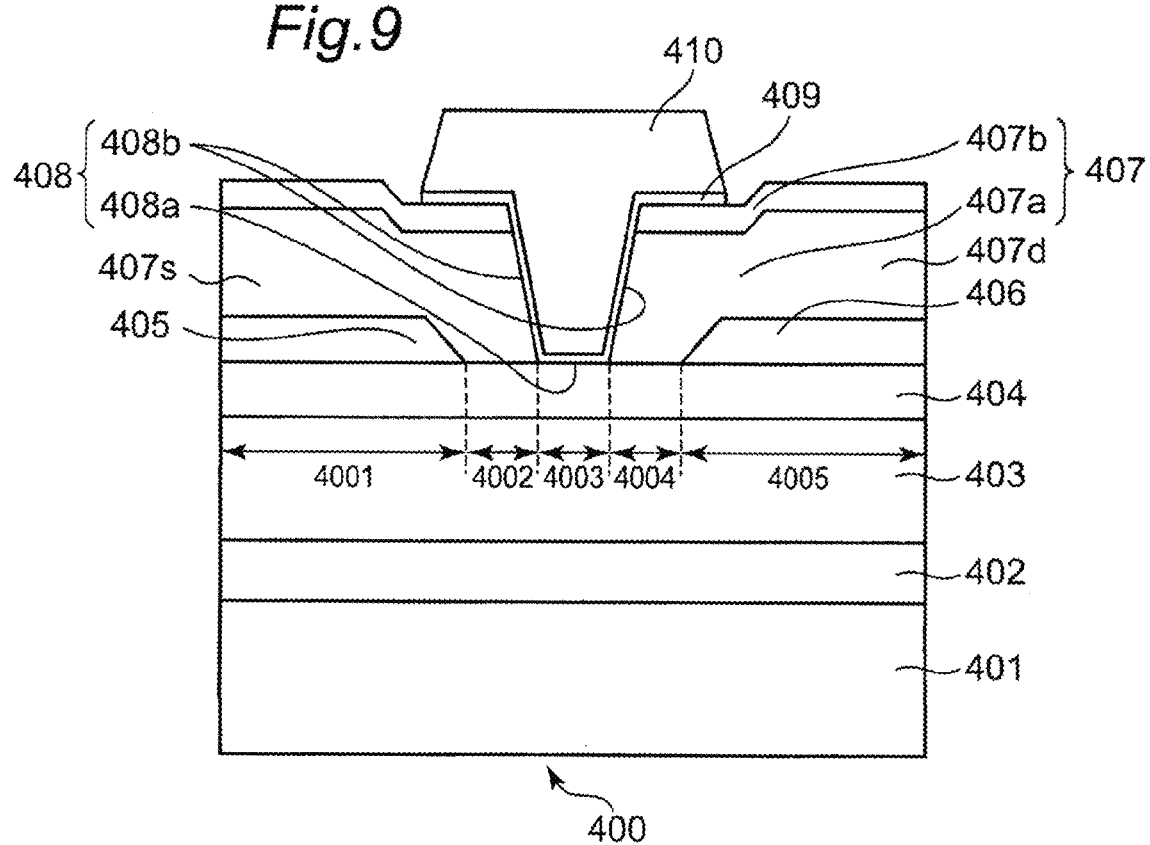
FIG. 9 is a cross-sectional view of a nitride semiconductor device of a third embodiment according to the present invention.

A nitride semiconductor device and a method of manufacturing the same of a third embodiment according to the present invention will hereinafter be described with reference to the accompanying drawings. FIG. 9 is a cross-sectional view of a nitride semiconductor device 400 of the third embodiment according to the present invention. The nitride semiconductor device 400 according to the third embodiment is a variation of the nitride semiconductor device 200 according to the first embodiment.

In the following description of the nitride semiconductor device 400 of the third embodiment, the same names are used for those having substantially the same meaning as in the nitride semiconductor device 200 of the first embodiment, and the constituent elements having the same functions are denoted by reference numerals of 400s to which the last two digits of the same reference numerals are added.

As depicted in FIG. 9, a hetero junction field effect transistor (HFET) is the nitride semiconductor device 400 of the third embodiment and has nitride semiconductors of a nitride buffer layer 402, a first nitride semiconductor layer 403, and a second nitride semiconductor layer 404 formed in this order on a first surface of a substrate 401.

A source electrode 405 and a drain electrode 406 are ohmic electrodes and formed on the second nitride semiconductor layer 404. An insulator protection film layer 407 is formed on the second nitride semiconductor layer 404 between the source electrode 405 and the drain electrode 406. The insulator protection film layer 407 is divided into two pieces of a source electrode side 407s and a drain electrode side 407d by a gate electrode 409. In other words, the gate layer 409 is formed on the second nitride semiconductor layer 404, dividing the insulator protection film layer 407 into two pieces of the source electrode side 407s and the drain electrode side 407d. As depicted in FIG. 9, the gate layer 409 is formed to be on the insulator protection film layer 407. A gate electrode 410 is formed on the entire upper surface of the gate layer 409, covering the gate layer 409.

In FIG. 9, in a direction substantially perpendicular to the first surface of the substrate 401 (the upper surface of the substrate 401 of FIG. 9), the second nitride semiconductor layer 404 has a first region 4001 having a surface formed in contact with the source electrode 405, a second region 4002 between the surface in contact with the source electrode 405 and a surface in contact with the gate layer 409, a third region 4003 having a surface formed in contact with the gate layer 409, a fourth region 4004 between the surface in contact with the gate layer 409 and a surface in contact with the drain electrode 406, and a fifth region 4005 having the surface formed in contact with the drain electrode 406.

As depicted in FIG. 9, the insulator protection film layer 407 is formed on the source electrode 405 (first region 4001) and the drain electrode 406 (fifth region 4005) and on the second region 4002 and the fourth region 4004 of the second nitride semiconductor layer 404. The second nitride semiconductor layer 404 has a constant film thickness at least from the second region 4002 to the fourth region 4004 and is formed with an Al composition.

The gate layer 409 is formed via the insulator protection film layer 307 on the first region 4001, the second region 4002, the fourth region 3004, and the fifth region 4004 of the second nitride semiconductor layer 404. In the third region 4003 of the second nitride semiconductor layer 404, the gate layer 409 is on the second nitride semiconductor layer 404 and is formed in contact with the second nitride semiconductor layer 404. Therefore, the insulator protection film layer 407 is divided into two pieces of the source electrode side 407s and the drain electrode side 407d by the gate layer 409. The gate layer 409 is made of a p-type metal oxide semiconductor.

A method of manufacturing an HFET defined as the nitride semiconductor device of the third embodiment configured as described above is substantially the same as the method of manufacturing an HFET defined as the nitride semiconductor device described in the first embodiment described above. Characteristic items of the manufacturing of the HFET according to the third embodiment will hereinafter be described.

<Gate Layer 409>

The gate layer 409 is formed in contact with the second nitride semiconductor layer 404 in a region opposite to the third region 4003 of the second nitride semiconductor layer 404 and is formed in contact with the insulator protection film layer 407 in regions opposite to the first region 4001, the second region 4002, the fourth region 4004, and the fifth region 4005 of the second nitride semiconductor layer 404.

In the HFET that is the nitride semiconductor in the third embodiment, the second nitride semiconductor layer 404 has the first region 4001 formed in contact with the source electrode 405, the second region 4002 from the region formed in contact with the source electrode 405 to the region formed in contact with the gate layer 409, the third region 4003 formed in contact with the gate layer 409, the fourth region 4004 from the region formed in contact with the gate layer 409 to the region formed in contact with the drain electrode 406, and the fifth region 4005 formed in contact with the drain electrode 406.

The gate layer 409 is normally formed by patterning or photolithography using a water repellent film and therefore is difficult to divide and form separately on the insulator protection film layer 407 opposite to the second region 4002 and the fourth region 4004 of the second nitride semiconductor layer 404 at the step of forming the gate layer 409. Therefore, the gate layer 409 is desirably formed as a continuous film body on the second nitride semiconductor layer 404 in the region opposite to the third region 4003 and the insulator protection film layer 407 in the regions opposite to the first region 4001, the second region 4002, the fourth region 4004, and the fifth region 4005.

The gate layer 409 is formed on the insulator protection film layer 407 on the first region 4001, the second region 4002, the fourth region 4004, and the fifth region 4005 of the second nitride semiconductor layer 404 in the direction perpendicular to the first surface of the substrate 401. The gate layer 409 is formed on the second nitride semiconductor layer 404 in the third region 4003 of the second nitride semiconductor layer 404. Therefore, when a positive voltage is applied to the gate electrode 410, the carrier concentration can be increased in the 2DEG layer formed in the interface between the first nitride semiconductor layer 403 under the second region 4002 and the fourth region 4004 of the second nitride semiconductor layer 404, and the second nitride semiconductor layer 404. Therefore, the ON-resistance can be reduced in the HFET that is the nitride semiconductor of the third embodiment.

When the insulator protection film layer 407 is formed relatively thin, the insulator protection film layer 407 easily becomes defective. If the insulator protection film layer 407 has a defect, a leak current of the gate layer 409 and the source electrode 405 increases, facilitating the occurrence of element destruction. These problems can be solved by forming a thick insulating film. In the HFET that is the nitride semiconductor of the third embodiment, as is the case with the HFET that is the nitride semiconductor of the first embodiment, both a configuration having the normally-off characteristic and a configuration achieving the reduction in the ON-resistance can be achieve at the same time.

The present invention is not limited to the embodiments described above and may variously be improved and modified within a range not departing from the spirit of the present invention.

The film thicknesses of the layers making up the nitride semiconductor device according to the present invention are not limited to the film thicknesses described above and may be changed as needed.

With regard to the nitride semiconductor device according to the present invention, the present invention includes another embodiment implemented by combining any constituent elements in the embodiments, modifications acquired by applying various modifications conceived by those skilled in the art within a range not departing from the spirit of the present invention to the embodiments, and various devices including the nitride semiconductor device according to the present invention. For example, the present invention includes power devices represented by a heterostructure field effect transistor (HFET) including the nitride semiconductor device according to the present invention.

To achieve the object of the present invention described above, a nitride semiconductor device according to a form of the present invention includes a substrate;

a nitride buffer layer formed on the substrate;

a first nitride semiconductor layer formed on the nitride buffer layer;

a second nitride semiconductor layer formed on the first nitride semiconductor layer and made of a material having a band gap larger than the first nitride semiconductor layer;

a source electrode formed on the second nitride semiconductor layer;

a drain electrode formed on the second nitride semiconductor layer and formed separately from the source electrode;

a source-electrode-side insulator protection film layer disposed between the source electrode and the drain electrode on the second nitride semiconductor layer and formed at least partially covering the source electrode in a forming region of the source electrode;

a drain-electrode-side insulator protection film layer disposed separately from the source-electrode-side insulator protection film layer on the second nitride semiconductor layer and formed at least partially covering the drain electrode;

a gate layer formed between the source-electrode-side insulator protection film layer and the drain-electrode-side insulator protection film layer to divide the layers from each other in contact with the second nitride semiconductor layer, the gate layer being made of a p-type metal oxide semiconductor; and a gate electrode formed entirely covering the gate layer and at least partially covering the insulator protection film layers, the gate layer including regions opposite to the second nitride semiconductor layer across each of the source-electrode-side insulator protection film layer and the drain-electrode-side insulator protection film layer and a region in contact with the second nitride semiconductor layer.

In the nitride semiconductor device of the present invention configured as described above, the gate layer has a surface in contact with the second nitride semiconductor layer and has regions opposite to the second nitride semiconductor layer across each of the source-electrode-side insulator protection film layer and the drain-electrode-side insulator protection film layer. Therefore, the nitride semiconductor device of the present invention has a normally-off characteristic and can reduce an ON-resistance.

In the nitride semiconductor device according to a form of the present invention, the second nitride semiconductor layer has a first region formed in contact with the source electrode, a second region between a region formed in contact with the source electrode and a region formed in contact with the gate layer, a third region formed in contact with the gate layer, a fourth region between a region formed in contact with the gate layer and a region formed in contact with the drain electrode, and a fifth region formed in contact with the drain electrode. The insulator protection film layers are formed on the first region, the second region, the fourth region, and the fifth region of the second nitride semiconductor layer, and the second nitride semiconductor layer has a constant film thickness from the second region to the fourth region and is formed with an Al composition. The gate layer is formed opposite to the third region and in contact with the second nitride semiconductor layer on the second nitride semiconductor layer and is formed on the insulator protection film layers via the insulator protection film layers in the second region and the fourth region. The gate layer is made of a p-type metal oxide semiconductor.

As described above, the second nitride semiconductor layer has a constant film thickness from the second region to the fourth region and is formed with an Al composition. The nitride semiconductor device of the present invention configured in this way can maintain a state of a high carrier concentration of a two-dimensional electron gas (2DEG) layer formed in an interface between the first nitride semiconductor layer under the second region to the fourth region of the second nitride semiconductor layer and the second nitride semiconductor layer when a direction perpendicular to the first surface of the substrate is defined as an up-down direction. As a result, the ON-resistance can be reduced in the nitride semiconductor device of the present invention.

In the nitride semiconductor device of the present invention, the gate layer is formed opposite to the third region and in contact with the second nitride semiconductor layer when viewed in a perpendicular direction from the substrate. Therefore, when the gate electrode is 0 V in the configuration of the nitride semiconductor device of the present invention, the electrons of the 2DEG layer are in a depleted state, i.e., the normally-off characteristic can be acquired.

When a positive voltage is applied to the gate electrode, the carrier concentration can be increased in the 2DEG layer formed in the interface between the first nitride semiconductor layer under the second region and the fourth region of the second nitride semiconductor layer 404 and the second nitride semiconductor layer 404 when viewed perpendicularly from the substrate and, therefore, the ON-resistance can be reduced. In the nitride semiconductor device of the preset invention configured in this way, both a configuration having the normally-off characteristic and a configuration reducing the ON-resistance can be achieved at the same time.

The p-type metal oxide semiconductor is preferably made of nickel oxide. According to such a configuration, nickel oxide can acquire a high hole concentration. Therefore, the nitride semiconductor device according to the present invention can acquire the normally-off characteristic.

The hole concentration of the p-type oxide semiconductor is preferably equal to or greater than $5 \times 10^{15}$ $cm^{-3}$ and equal to or less than $1 \times 10^{19}$ $cm^{-3}$ and more desirably equal to or greater than $3 \times 10^{18}$ $cm^{-3}$ and equal to or less than $1 \times 10^{19}$ $cm^{-3}$. The nitride semiconductor device according to the present invention configured in this way can acquire the normally-off characteristic.

A method of manufacturing a nitride semiconductor device according to a form of the present invention includes the steps of forming a nitride buffer layer on a substrate;

forming a first nitride semiconductor layer on the nitride buffer layer;

forming a second nitride semiconductor layer on the first nitride semiconductor layer, the second nitride semiconductor layer having an Al composition higher than the first nitride semiconductor layer;

forming a source electrode and a drain electrode on the second nitride semiconductor layer at a distance from each other;

forming an insulator protection film layer on the second nitride semiconductor layer including upper portions of the source electrode and the drain electrode;

forming an opening portion in the insulator protection film layer between the source electrode and the drain electrode;

forming a gate layer to cover the opening portion and the insulator protection film layer; and forming a gate electrode on the gate layer, wherein in the method of manufacturing the gate layer, the opening portion is configured to have a surface of the second nitride semiconductor layer and a surface of the insulator protection film layer, and wherein the step of forming the gate layer includes a water repellent film forming step of applying patterning through chemical modification with a water repellent film layer onto the insulator protection film layer except a region to be provided with the gate layer so as to selectively grow the gate layer by using an atomic layer deposition method. According to the method of manufacturing a nitride semiconductor device of the present invention as described above, a nitride semiconductor device having a normally-off characteristic can be manufactured.

In the method of manufacturing a nitride semiconductor device of the present invention, at the step of forming the second nitride semiconductor layer, the second nitride semiconductor layer having a band gap larger than the first nitride semiconductor layer may be formed.

A method of manufacturing a nitride semiconductor device according to a form of the present invention may include the steps of forming a nitride buffer layer on a substrate;

forming a first nitride semiconductor layer on the nitride buffer layer;

forming a second nitride semiconductor layer on the first nitride semiconductor layer, the second nitride semiconductor layer having an Al composition higher than the first nitride semiconductor layer;

forming an insulator protection film layer on the second nitride semiconductor layer;

forming an opening portion in the insulator protection film layer, the opening portion having a bottom surface defined as a surface of the second nitride semiconductor layer;

forming a gate layer to cover the opening portion; and forming a gate electrode of a p-type metal oxide semiconductor on the gate layer, and removing the insulator protection film layer on both sides of the gate electrode to form a source electrode and a drain electrode at a distance from each other on the second nitride semiconductor layer by a self-alignment method using the gate layer and the gate electrode, wherein in the method of manufacturing the gate layer, the step of forming the gate layer includes a water repellent film forming step of applying patterning through chemical modification with a water repellent film layer onto the insulator protection film layer except a region to be provided with the gate layer so as to selectively grow the gate layer by using an atomic layer deposition method.

According to the method of manufacturing a nitride semiconductor device of the present invention as described above, the gate layer is formed by using an atomic layer deposition method and, therefore, a cation atom deficiency or an oxygen concentration can conveniently be achieved. As a result, according to the present invention, a p-type metal oxide semiconductor with a high hole concentration can be manufactured, and the manufactured nitride semiconductor device can be configured to have a normally-off characteristic.

According to the method of manufacturing a nitride semiconductor device of the present invention, refinement can be achieved by performing the patterning using the water repellent film layer and, therefore, the nitride semiconductor device having a smaller ON-resistance can be manufactured. In the present invention, both a configuration having the normally-off characteristic and a configuration having a reduced ON-resistance can be achieved at the same time by the manufacturing method using the formation of the gate layer by the atomic layer deposition method and the patterning using the water repellent film layer.

Although the present invention has been described in detail to a certain extent in terms of the embodiments, the contents of the disclosure of the embodiments may naturally vary in terms of details of configuration, and the combination and order of the elements in the embodiments may be changed without departing from the scope and the spirit of the present invention.

INDUSTRIAL APPLICABILITY

The nitride semiconductor device of the present invention is useful for power devices such as a hetero-junction field effect transistor using a nitride semiconductor required to be normally-off and to have a reduced ON-resistance.

REFERENCE SIGNS LIST 100, 200, 300, 400 nitride semiconductor device
101, 201, 301, 401 substrate
102, 202, 302, 402 nitride buffer layer
103, 203, 303, 403 first nitride semiconductor layer
104, 204, 304, 404 second nitride semiconductor layer
105, 205, 305, 405 source electrode
106, 206, 306, 406 drain electrode
207, 307, 407 insulator protection film layer
109, 209, 309, 409 gate layer
110, 210, 310, 410 gate electrode
207a, 307a, 407a nitride insulator protection film layer
207b, 307b, 407b oxide insulator protection film layer
208a, 308a, 408a surface of second nitride semiconductor layer
208b, 308b, 408b side surface of insulator protection film layer
211, 311 water repellent film layer

The invention claimed is:

1. A nitride semiconductor device comprising:
a substrate;
a nitride buffer layer formed on the substrate;
a first nitride semiconductor layer formed on the nitride buffer layer;
a second nitride semiconductor layer formed on the first nitride semiconductor layer and made of a material having a band gap larger than the first nitride semiconductor layer;
a source electrode formed on the second nitride semiconductor layer;
a drain electrode formed on the second nitride semiconductor layer and formed separately from the source electrode;
an insulator protection film layer that includes a source-electrode-side insulator protection film layer and a drain-electrode-side insulator protection film layer, the source-electrode-side insulator protection film layer being disposed between the source electrode and the drain electrode on the second nitride semiconductor layer and formed at least partially covering the source electrode, and the drain-electrode-side insulator protection film layer being disposed separately from the source-electrode-side insulator protection film layer on the second nitride semiconductor layer and formed at least partially covering the drain electrode;
a gate layer formed between the source-electrode-side insulator protection film layer and the drain-electrode-side insulator protection film layer to be in contact with the second nitride semiconductor layer, the gate layer being made of a p-type metal oxide semiconductor;
a gate electrode formed entirely covering the gate layer and at least partially covering the insulator protection film layers, and
a water repellent film layer formed in an interface between the insulator protection film layer and the gate electrode,
the gate layer including regions opposite to the second nitride semiconductor layer across each of the source-electrode-side insulator protection film layer and the drain-electrode-side insulator protection film layer and a region in contact with the second nitride semiconductor layer,
wherein the insulator protection film layer comprises an oxide insulator protection film layer formed on a nitride insulator protection film layer, the insulator protection film being equal to or greater than 10 nm and equal to or less than 200 nm in thickness, the oxide insulator protection film layer being equal to or greater than 1 nm and equal to or less than 50 nm in thickness, and
the water repellent film layer is formed by a fluorocarbon chain or a hydrocarbon chain, the fluorocarbon chain including $CF_3(CF_2)_7C_2H_4SiCl$, the hydrocarbon chain including $CH_3(CH_2)_{17}SiCl_3$.

2. The nitride semiconductor device of claim 1, wherein the source electrode and the drain electrode have a distance between electrodes equal to or less than 5 μm.

3. The nitride semiconductor device of claim 1, wherein the p-type metal oxide semiconductor is nickel oxide.

4. The nitride semiconductor device of claim 1, wherein the hole concentration of the p-type metal oxide semiconductor is equal to or greater than $1\times10^{17}$ cm$^{-3}$ and equal to or less than $1\times10^{19}$ cm$^{-3}$.

5. The nitride semiconductor device of claim 3, wherein the p-type metal oxide semiconductor made of nickel oxide is doped with an alkali metal including lithium, sodium, potassium, rubidium, and cesium equal to or greater than $1\times10^{17}$ cm$^{-3}$ and equal to or less than $1\times10^{21}$ cm$^{-3}$.

6. The nitride semiconductor device of claim 1, wherein the p-type metal oxide semiconductor is a monocrystalline semiconductor having a (111) orientation.

7. The nitride semiconductor device of claim 1, wherein the p-type metal oxide semiconductor is formed on the insulator protection film layer formed on upper portions of the source electrode and the drain electrode.

8. The nitride semiconductor device of claim 1,
wherein the first nitride semiconductor layer is made of $Al_xGa_{1-x}N$ ($0<x<1$), and wherein
the second nitride semiconductor layer is made of $Al_xIn_yGa_{1-x-y}N$($0\leq x<1$, $0\leq y<1$).

9. A nitride semiconductor device having a normally-off characteristic comprising:
a substrate;
a nitride buffer layer formed on the substrate;
a first nitride semiconductor layer formed on the nitride buffer layer;
a second nitride semiconductor layer formed on the first nitride semiconductor layer and having an Al composition higher than the first nitride semiconductor layer;
a source electrode and a drain electrode formed on the second nitride semiconductor layer at a distance from each other;
an insulator protection film layer formed in a region between the source electrode and the drain electrode and having an opening portion for division into a source electrode side and a drain electrode side;
a gate layer formed covering at least a side surface and a bottom surface of the opening portion;
a gate electrode formed covering the gate layer, and
a water repellent film layer formed in an interface between the insulator protection film layer and the gate electrode,
the side surface of the opening portion being a surface of the insulator protection film layer, the bottom surface of the opening portion being a surface of the second nitride semiconductor layer,
the source electrode, the gate layer, and the drain electrode being formed on the same plane on the second nitride semiconductor layer,
the gate layer being made of a p-type metal oxide semiconductor,
wherein the insulator protection film layer comprises an oxide insulator protection film layer formed on a nitride insulator protection film layer, the insulator protection film being equal to or greater than 10 nm and equal to or less than 200 nm in thickness, the oxide insulator protection film layer being equal to or greater than 1 nm and equal to or less than 50 nm in thickness, and
the water repellent film layer is formed by a fluorocarbon chain or a hydrocarbon chain, the fluorocarbon chain includes $CF_3 (CF_2)_7C_2H_4SiCl$, the hydrocarbon chain includes $CH_3 (CH_2)_{17}SiCl_3$.

10. The nitride semiconductor device of claim 9, wherein the p-type metal oxide semiconductor is formed in the opening potion and an upper portion of the insulator protection film layer.

11. The nitride semiconductor device of claim 9, wherein the p-type metal oxide semiconductor is formed only in the opening potion.

12. A nitride semiconductor device having a normally-off characteristic comprising:
a substrate;
a nitride buffer layer formed on the substrate;

a first nitride semiconductor layer formed on the nitride buffer layer;

a second nitride semiconductor layer formed on the first nitride semiconductor layer and having an Al composition higher than the first nitride semiconductor layer;

a source electrode and a drain electrode formed on the second nitride semiconductor layer at a distance from each other;

an insulator protection film layer formed in a region between the source electrode and the drain electrode and having an opening portion for division into a source electrode side and a drain electrode side;

a gate layer formed covering at least a side surface and a bottom surface of the opening portion;

a gate electrode formed covering the gate layer, and a water repellent film layer formed in an interface between the insulator protection film layer and the gate electrode, the side surface of the opening portion being a surface of the insulator protection film layer, the bottom surface of the opening portion being a surface of the second nitride semiconductor layer, the gate layer formed in the opening portion of the insulator protection film layer being divided via a space for the source electrode and the drain electrode, the source electrode, the gate layer, and the drain electrode being formed on the same plane on the second nitride semiconductor layer, the gate layer being made of a p-type metal oxide semiconductor, wherein the insulator protection film layer comprises an oxide insulator protection film layer formed on a nitride insulator protection film layer, the insulator protection film being equal to or greater than 10 nm and equal to or less than 200 nm in thickness, the oxide insulator protection film layer being equal to or greater than 1 nm and equal to or less than 50 nm in thickness, and the water repellent film layer is formed by a fluorocarbon chain or a hydrocarbon chain, the fluorocarbon chain includes $CF_3(CF_2)_7C_2H_4SiCl$, the hydrocarbon chain includes $CH_3(CH_2)_{1\ 7}SiCl_3$.

13. A method of manufacturing a nitride semiconductor device comprising the steps of:

forming a nitride buffer layer on a substrate;

forming a first nitride semiconductor layer on the nitride buffer layer;

forming a second nitride semiconductor layer on the first nitride semiconductor layer, the second nitride semiconductor layer having an Al composition higher than the first nitride semiconductor layer;

forming a source electrode and a drain electrode on the second nitride semiconductor layer at a distance from each other;

forming an insulator protection film layer on the second nitride semiconductor layer including upper portions of the source electrode and the drain electrode, the insulator protection film being equal to or great than 10 nm and equal to or less than 200 nm in thickness;

forming an opening portion in the insulator protection film layer between the source electrode and the drain electrode;

forming a gate layer to cover the opening portion and at least a portion of the insulator protection film layer; and forming a gate electrode on the gate layer, wherein in the method of manufacturing the gate layer, the opening portion is configured to have a surface of the second nitride semiconductor layer and a surface of the insulator protection film layer, and wherein the step of forming the gate layer includes a water repellent film forming step of applying patterning through chemical modification with a water repellent film layer onto the insulator protection film layer except a region to be provided with the gate layer so as to selectively grow the gate layer by using an atomic layer deposition method, the step of forming the insulator protection film layer includes a step of forming an oxide insulator protection film layer on a nitride insulator protection film layer, the thickness of the oxide insulator protection film layer being equal to or greater than 1 nm and equal to or less than 50 nm, and the water repellent film forming step includes a step of forming a water repellent film from a silane coupling agent having a fluorocarbon chain or a hydrocarbon chain, the fluorocarbon chain includes $CF_3(CF_2)_7C_2H_4SiCl$ and the hydrocarbon chain includes $CH_3(CH_2)_{1\ 7}SiCl_3$.

14. The method of manufacturing a nitride semiconductor device of claim 13, comprising a step of annealing in an oxygen atmosphere after formation of the gate layer, and wherein the gate layer is made of nickel oxide and has a hole concentration equal to or greater than $1\times10^{17}$ cm$^{-3}$ and equal to or less than $1\times10^{19}$ cm$^{-3}$.

15. A method of manufacturing a nitride semiconductor device comprising the steps of:

forming a nitride buffer layer on a substrate;

forming a first nitride semiconductor layer on the nitride buffer layer;

forming a second nitride semiconductor layer on the first nitride semiconductor layer, the second nitride semiconductor layer having an Al composition higher than the first nitride semiconductor layer;

forming an insulator protection film layer on the second nitride semiconductor layer, the insulator protection film being equal to or greater than 10 nm and equal to or less than 200 nm in thickness;

forming an opening portion in the insulator protection film layer, the opening portion having a bottom surface defined as a surface of the second nitride semiconductor layer;

forming a gate layer to cover the opening portion; and forming a gate electrode of a p-type metal oxide semiconductor on the gate layer, and removing the insulator protection film layer on both sides of the gate electrode to form a source electrode and a drain electrode at a distance from each other on the second nitride semiconductor layer by a self-alignment method using the gate layer and the gate electrode, wherein in the method of manufacturing the gate layer, the step of forming the gate layer includes a water repellent film forming step of applying patterning through chemical modification with a water repellent film layer onto the insulator protection film layer except a region to be provided with the gate layer so as to selectively grow the gate layer by using an atomic layer deposition method, the step of forming the insulator protection film layer includes a step of forming an oxide insulator protection film layer on a nitride insulator protection film layer, the thickness of the oxide insulator protection film layer being equal to or greater than 1 nm and equal to or less than 50 nm, and the water repellent film forming step includes a step of forming a water repellent film from a silane coupling agent having a fluorocarbon chain or a hydrocarbon chain, the fluorocarbon chain includes $CF_3(CF_2)_7C_2H_4SiCl$, the hydrocarbon chain includes $CH_3(CH_2)_{17}SiCl_3$.

\* \* \* \* \*